(12) United States Patent
Raab

(10) Patent No.: US 7,202,734 B1
(45) Date of Patent: Apr. 10, 2007

(54) ELECTRONICALLY TUNED POWER AMPLIFIER

(76) Inventor: Frederick Herbert Raab, Green Mountain Radio Research Company, 50 Vermont Ave., Colchester, VT (US) 05446

( * ) Notice: Subject to any disclaimer, the term of this patent is extended or adjusted under 35 U.S.C. 154(b) by 227 days.

(21) Appl. No.: 09/610,933

(22) Filed: Jul. 6, 2000

Related U.S. Application Data

(60) Provisional application No. 60/180,746, filed on Feb. 7, 2000, provisional application No. 60/142,419, filed on Jul. 6, 1999.

(51) Int. Cl.
*H03F 3/04* (2006.01)

(52) U.S. Cl. ............... 330/126; 330/192; 330/302; 330/305; 330/306; 330/284; 455/74

(58) Field of Classification Search ........... 330/126, 330/192, 302, 305, 306, 284; 455/74, 107, 455/121, 129
See application file for complete search history.

(56) References Cited

U.S. PATENT DOCUMENTS

| | | | |
|---|---|---|---|
| 3,391,347 A * | 7/1968 | Bosse et al. | 330/305 |
| 3,424,993 A * | 1/1969 | Clar | 330/298 |
| 3,919,656 A * | 11/1975 | Sokel et al. | 330/51 |
| 4,803,440 A * | 2/1989 | Hotta et al. | 330/145 |
| 4,977,380 A | 12/1990 | Martin | |
| 5,065,118 A | 11/1991 | Collins | |
| 5,187,454 A | 2/1993 | Collins | |
| 5,423,074 A * | 6/1995 | Dent | 455/74 |
| 5,483,158 A | 1/1996 | van Heteren | |
| 5,585,766 A | 12/1996 | Shel | |
| 5,680,073 A | 10/1997 | Nathan | |
| 5,862,458 A * | 1/1999 | Ishii | 455/107 |
| 5,914,513 A | 6/1999 | Shenai | |
| 5,999,077 A | 12/1999 | Hammond | |
| 6,232,841 B1 * | 5/2001 | Bartlett et al. | 330/305 |
| 6,253,068 B1 | 6/2001 | Elder | |

FOREIGN PATENT DOCUMENTS

JP    2000307353    * 11/2000

OTHER PUBLICATIONS

Ho et al. "A W-Band Integrated Power Module Using MMIC MESFET Power Amplifiers and Varactor Doublers" IEEE Transactions on Microwave Theory and Techniques vol. 41, Issue 12, Dec. 1993 pp. 2288-2294.*

Xreferplus Dictionary definition for "Power Amplifier" Collin English Dictionary 2000.*

K. Jeganathan, Design of a simple tunable/switchable bandpass design, Applied Microwave & Wireless, vol. 12, No. 3, pp. 32-40, Mar. 2000.

(Continued)

*Primary Examiner*—Michael B Shingleton
(74) *Attorney, Agent, or Firm*—Theodore R. Touw; James Marc Leas

(57) ABSTRACT

A circuit and method for electronically tuning an RF power amplifier. The output filter includes at least one electronically variable reactance. The electronically tuned power amplifier may be tuned rapidly to a selected frequency, to a selected impedance, or to produce a selected output amplitude. An optional controller translates frequency, impedance, or modulation inputs into tuning signals. High-efficiency, wideband amplitude modulation is produced by varying the amplifier load impedance along preferred loci.

64 Claims, 15 Drawing Sheets

OTHER PUBLICATIONS

E. R. Brown, RF-MEMS switches for reconfigurable integrated circuits, IEEE Trans. Microwave Theory Tech., Pt. 2, vol. 46, No. 1, pp. 1868-1880, Nov. 1998.

Electronically tunable RF filters for LMDS frequecies, Microwave J., May 2000. vol. 43, No. 5, pp. 384-386, May 2000.

C. Trask, The forgotten use of saturable-core inductors (transductors) Applied Microwave & Wireless, vol. 9, No. 5, pp. 76-82, Sep./Oct. 1997.

F. Giannini, E. Limiti, G. Orengo, and P. Sanzi, A monolithic notch tunable filter based upon the gyrator principle, Int. Microwave Symp. Digest, vol. 2, pp. 809-812, Denver, CO, Jun. 8-13, 1997.

W. E. Doherty, Jr., and R. D. Joos, PIN diodes offer high-power HF-band switching, Microwaves & RF, vol. 32, No. 12, pp. 119-128, Dec. 1993.

MEMS-based filter achieves high efficiency and low insertion loss, Microwaves & RF, vol. 39, No. 3, p. 23, Mar. 2000.

S. H. L Tu and C. Toumazou, Design of highly-efficient class-E RF power amplifiers, Proc. ISCAS, pp. 11-602-11-605, 1999.

H. L. Krauss C. W. Bostian, and F. H. Raab, Solid State Radio Engineering, Chapters 12-14, New York, Wiley, 1980.

F. H. Raab, Average efficiency of power amplifiers, Proc. RF Technology Expo '86, Anaheim, CA, pp. 474-486, Jan. 30-Feb. 1, 1986.

F. H. Raab, Idealized operation of the class E tuned power amplifier, IEEE Trans. Circuits and Syst., vol. CAS-24, No. 12, pp. 725-735, Dec. 1977.

F. H. Raab, Suboptimum operation of class-E RF power amplifiers, Proc. RF Technology Expo '89, Santa Clara, CA, pp. 85-98, Feb. 14-16, 1989.

F. H. Raab, Efficiency of outphasing power-amplifier systems, IEEE Trans. Commun., vol. COM-33, No. 10, pp. 1094-1099, Oct. 1985.

* cited by examiner

ELECTRONICALLY TUNED POWER AMPLIFIER

This application is related to U.S. Provisional Patent Applications Ser. No. 60/142,419, "Electronically tunable RF-power amplifiers and matching networks," filed on Jul. 6, 1999, and to Ser. No. 60/180,746, "High-efficiency transmitter techniques," filed on Feb. 7, 2000.

TECHNICAL FIELD

The present invention relates to the field of amplifiers for audio, radio, and microwave frequencies, used in conjunction with filters, matching networks, and modulators in systems such as transmitters and induction heaters, and more specifically to methods for enabling power amplifiers and transmitters to operate safely and efficiently over large bands of frequency, large variations in load impedance, and large ranges in signal amplitude.

BACKGROUND ART

A power amplifier (PA) operates most efficiently when matched to its load. In most power amplifiers, and especially in the high-efficiency types, the tuning network is an integral part of the amplifier and proper tuning is essential for proper operation. Proper tuning promotes not only high efficiency, but also output power, stability, gain, and other desirable operating characteristics.

The tuning of power amplifiers has to date been accomplished by either fixed, mechanically tuned, or switched components. Fixed-tuned amplifiers have the obvious limitation of allowing proper operation over only one small range of frequencies or load impedances.

Mechanically variable tuning components include moveable-plate capacitors and roller inductors. While these extend the range of frequencies and impedances over which a PA can operate, changing frequency is a relatively slow process that must be done manually or by motors. This makes it too slow and cumbersome for many applications such as frequency-hopping and chirp signals.

Switching of tuning components can be accomplished by relays, pin diodes, MEMs (micro-electromechanical systems), MOSFETs, MESFETs, and other semiconductors. Typically, component values are selected in binary steps (1, 2, 4, 8, etc.) and a subset of the components is selected to approximate the desired capacitance or inductance. Relays offer low insertion loss, but are relatively large and slow. The various semiconductor switches offer high speed, but can have higher insertion loss. Additional loss occurs because of the components (e.g., RF chokes) that are required to feed the control signals to the switching components. There is an inherent trade-off between the range and accuracy of tuning and the number of components needed. Tuning over a large range with high accuracy can require an impractically large number of components.

Amplitude-modulated signals have to date been produced primarily by linear amplification or high-level amplitude modulation. Linear amplification offers wide bandwidth but is inherently inefficient. High-level amplitude modulation offers efficiency, but its bandwidth is limited by that of the high-level modulator.

The amplitude of the output of a power amplifier can be controlled by varying its the components in its tuning network. Mechanically tuned components cannot be varied fast enough to induce amplitude modulation at useable bandwidths. Switched components can in some cases adjust the tuning network fast enough, but the stepped nature of the resulting amplitude variation is unsuitable for high-quality amplitude-modulated signals. Variable attenuators can induce amplitude modulation, but do so by dissipating a significant portion of the power, resulting in an inefficient transmitter. Thus no currently existing techniques are capable of high-level amplitude modulation with significant bandwidth, quality, and/or efficiency.

Electronic tuning of small-signal circuits is a well-known art and can be accomplished by a variety of techniques. Varactor diodes are commonly used in applications such as voltage-controlled oscillators, phase shifters, frequency modulators, and phase modulators. Recently, micro-electromechanical systems (MEMS) and ceramic (especially barium-strontium-titanate, BST) devices have been developed for similar purposes.

Changes in inductance of ferromagnetic material with dc bias can also be used for electronic tuning. Because of nonlinearities, such tunable inductors (transductors) are used primarily in small-signal circuits such as receivers or low-power oscillators.

Electronically tuned filters for small-signal applications can also be implemented using an active-circuit "gyrator" to simulate the inductors. Such circuits are, however, unsuitable for use with power amplifiers as more power is required to operate them than is saved by the tuning process.

Variable ferrite inductors and transmission lines have been used in matching networks for plasmas. In such applications, the production of a clean, harmonic-free signal is not required, nor is modulation of the output signal.

The amplification of amplitude-modulated signals (including complex signals) has traditionally been done by linear power amplifiers (PAs). Since the efficiency of linear PAs varies with signal amplitude, such PAs are very inefficient for production of signals with significant peak-to-average ratios. The Kahn envelope-elimination-and-restoration technique ideally offers high efficiency at all signal amplitudes and has recently demonstrated significant improvements in average efficiency for amplitude-modulated signals. However, its bandwidth is limited by that of its high-level amplitude modulator.

DISCLOSURE OF THE INVENTION

Disclosed herein is a method and apparatus for electronically tuning and modulating power amplifiers, including the associated filters, matching networks, and combiners. Electronic tuning of a power amplifier allows operation with maximum efficiency and other desirable characteristics over a wide range of frequencies and a wide range of possibly changing load impedances. It also allows efficient modulation of the signal amplitudes with high quality and large bandwidth.

The embodiment of the invention shown in FIG. 1 comprises a power amplifier (PA) 10 and electronically tuned filter 11. Power amplifier produces a signal output 13 in response to drive input 12. Power-amplifier output 13 is coupled to the RF input of the electronically tuned filter 11, whose output 18 is coupled to load 19 for delivery of RF power. Load 19 may be resistive or may include both resistance and reactance; it may be fixed or variable, linear or nonlinear. Electronically tuned filter 11 includes at least one electronically variable reactive element responsive to a control input 15. Preferably, all components of filter 11 have low losses so that the network delivers the vast majority of its input power to its load. Filter RF output 18 is coupled to the load. The control input 15 may be one or more voltages, currents, optical signals, or any other convenient nonmechanical stimuli. Adjustment of the variable element(s) by the control input allows the filter to be tuned for a range of frequencies, impedances, or signal amplitudes. For example, the filter may be caused to tune to the frequency of the drive signal, to match to a load impedance, or to load the power amplifier so as to produce a desired output amplitude and phase.

The power amplifier (PA) may be any type suitable to the frequency and power level of the desired output signal. As is well known, the requirements for the output-tuning filter depend upon the type of amplifier. For the highest efficiency, PAs of classes D, E, and F are preferred. For class-D, it is desirable to provide a resistive load at the fundamental frequency and high impedances at the harmonics. For class E, it is desirable to provide a fundamental-frequency load consisting of a resistance and inductive reactance in series and high impedances at the harmonics. For class F, a resistive load at the fundamental frequency is desirable and the harmonic impedances should be either significantly larger or significantly smaller than the fundamental-frequency impedance.

As is also well known, tuning networks can be implemented in a wide variety of forms. Three of many possible examples of tuning networks suitable for a single-ended power amplifier such as class C or E are shown in FIGS. 2, 3, and 4.

In the circuit of FIG. 2. RF choke 24 couples dc from power supply 23 to MOSFET 20, which generates a high-power RF signal at its drain 25. Conventional circuits well known to those familiar with the state of the art are used to couple RF drive and bias signals to gate 21 of MOSFET 20. Blocking capacitor 26 couples the RF signal from MOSFET drain 25 to the tuning network 30 while blocking the passage of dc. Tuning network 30 includes fixed inductor 35 and electronically variable capacitors 32 and 37. Bias voltages to adjust capacitors 32 and 37 are coupled through resistors 33 or 38 or through RF chokes. Capacitors 31 and 36 block passage of the bias voltages to other parts of the tuning network. RF output is coupled to the load at 29.

In the circuit of FIG. 3, electronically tuned filter 40 comprises fixed tuning capacitors 41 and 45 and electronically variable inductor 42. The reactance of inductor 42 varies in response to control current in bias coil 43. Bias current is supplied through terminals 44A and 44B.

In the circuit of FIG. 4, electronically tuned filter 50 comprises fixed tuning capacitor 51 and electronically variable transmission lines 52 and 56. Bias voltages for adjusting the variable transmission lines are coupled to the lines from tuning inputs 54 and 58 through resistors 53 and 57 or RF chokes. Blocking capacitors 55A, 55B, and 55C prevent passage of the bias voltages to other components.

Obviously, these and other tuning networks can be implemented with various combinations of fixed and electronically variable capacitors, inductors, and transmission lines. Switches including relays, pin diodes, and other devices can also be used to select components to extend the tuning range. Transformers can also be included.

A wide variety of electronically variable components now exists, and additional components will no doubt be developed. Electronically variable capacitance can be provided by a wide variety of semiconductors, ceramics (e.g., barium-strontium-titanate), MEMS devices, and piezo-electric devices. Semiconductors with voltage-variable capacitance include bipolar transistors, field-effect transistors, diodes, and special-purpose devices such as three-terminal controlled-capacitance diodes. Electronically variable inductance can be provided by bias-tuned inductors (also known as saturable reactors), in which a control magnetic field changes the permeability of the core. It can also be provided by piezo-electric inductors, in which a piezo-electric transducer moves a piece of a ferrite inductor to change the gap spacing. Electronically variable transmission lines can be implemented by either loading them with a ferrite whose permeability can be changed by a bias field or building them on a variable-dielectric substrate such as barium-strontium-titanate.

An electronically tunable power amplifier can be based upon a wide variety of power-amplifier techniques and a wide variety of active devices. Power amplifiers are commonly designated class A, B, C, D, E, F, G, and S (see H. L. Krauss, C. W. Bostian, and F. H. Raab, *Solid State Radio Engineering*, Chapters 12–14, New York, Wiley, 1980). The active device(s) can be a bipolar junction transistor (BJT), field-effect transistor (FET), metal-oxide field-effect transistor (MOSFET), junction field-effect transistor (JFET), metal semiconductor FET (MESFET), heterojunction FET (HFET), high-electron-mobility transistor (HEMT), pseudomorphic HEMT (pHEMT), heterojunction bipolar transistors (HBT), vacuum tube, klystron, magnetron, or a variety of other devices that are continually being developed. Different devices are, of course, preferred for different frequencies, power levels, and classes of operation.

FIG. 5 illustrates an embodiment of the invention that facilitates control for the desired purpose. The desired frequency, impedance, or modulation 60 is input to controller 61. Controller 61 converts the desired frequency, impedance, or modulation into the specific voltage, current, optical signal, or other stimulus needed to adjust the electronically tuned filter 11. The output 15 of controller 61 is coupled to the control input of electronically tuned filter 11. Controller 61 may be based upon digital techniques (such as look-up tables) or analog techniques (such as function modules), or any other convenient mechanism. It may include power supplies, D/A converters, detectors, and such other supporting hardware as is needed.

FIG. 6 illustrates the use of feedback to facilitate control of the electronically tuned filter. Three of many possible examples are shown. Amplifier output 13 may be sampled by a suitable means to produce an RF sample 62 which is coupled to a sample input of controller 61. The output of filter 11 may be sampled by a device such as directional coupler 63 whose output 64 is coupled to a sample input of controller 61. The input from an antenna 65 may also be used to obtain a sample of a radiated signal for coupling to a sample input of controller 61. Controller 61 is responsive to input signal 60 and one or more feedback signals (62, 64, and 65) and adjusts control signal 15 to cause the one or more feedback signals to match the desired signal specified by input 60. The controller can employ digital, analog, or any other suitable technique. The sampling devices may be direct connections, directional couplers, small capacitors, or any other suitable means.

Many electronically variable components are inherently nonlinear and consequently produce harmonics. When system requirements mandate harmonic levels lower than those produced in the electronically tuned filter, a conventional fixed filter 70 may be added as shown in FIG. 7. Output 18 from electronically tuned filter 11 is coupled to fixed filter 70, whose output 71 becomes the output of the electronically tuned amplifier. Fixed filter 70 blocks harmonics from reaching the load while passing the desired signal. It is implemented from conventional components and therefore inherently linear.

In many applications, both the input and output of a power amplifier must be tuned for best performance. The embodiment shown in FIG. 8 places a second electronically tuned network 72 with control input 74 between drive input 12 and power amplifier 10. By the application of suitable control signals 74 and 15, both the input and output networks are caused to provide the proper tuning for the desired frequency, load impedance, and signal level.

Modulation

Amplitude modulation of the output signal is accomplished by using the electronically tuned filter to vary the load impedance presented to the drain or collector of the power amplifier. Consequently, the amount of output power produced by the PA varies with time. This in turn causes the amplitude (envelope) of the output signal to vary with time. Preferably, the impedance is varied along a locus that results in significant variation of the output voltage while maintaining high efficiency. Since the electronically tuned filter can be tuned rapidly, the electronically tuned power amplifier can be used to produce wide-bandwidth amplitude-modulated signals with high efficiency. Phase modulation can also be introduced by the electronically tuned filter if desired.

The term "amplitude-modulated signal" as used herein refers to any signal whose amplitude varies with time. Complex signals such as single-sideband, vestigial sideband, and shaped-pulse phase-shift keying are included as they are equivalent to simultaneous amplitude and phase modulations.

A means of producing complex signals using the electronically tuned power amplifier is shown in FIG. 9. Input signal 80 is coupled to optional limiter or drive controller 82, producing a drive signal 12 that contains the phase information in input signal 80. Input signal 80 is also coupled to envelope detector 84, which produces envelope 85. Envelope 85 is input to optional controller 61 which produces the control signal 15 for electronically tuned filter 11. Drive signal 12 is input to power amplifier 10, whose output is coupled to electronically tuned filter 11. The output of electronically tuned filter 11 is in turn coupled to load 19. Electronically tuned filter 11 produces a time-varying load impedance $Z_L$ for power amplifier 10 in response to control signal 15. Variation of $Z_L$ over time causes the amount of power drawn from power amplifier 10 to vary over time, and this in turn causes the amplitude of output signal 18 to vary over time, thus producing amplitude modulation. Electronically tuned filter 11 can also be operated to produce a time-varying phase shift or delay to introduce phase modulation into the output signal. Envelope 85 and phase-modulated carrier 83 can alternatively be produced directly by a digital signal processor and associated signal-synthesis hardware, as is well known to those familiar with the state of the art. Operation of the invention as an efficient amplitude modulator is illustrated through several examples that follow.

For ideal power amplifiers of classes A, B, C, D, and F, the power output $P_o$ at saturation is given by $$P_O = \frac{cV_{DD}^2}{R_D}$$

where $V_{DD}$ is the supply voltage, $R_D$ is the parallel-resistance component of the impedance presented to the PA by the output filter, and c is a constant that depends upon the amplifier. Consequently, contours of constant output power (hence constant output voltage) follow the parallel-resistance circles on a Smith chart, as shown in FIG. 10. If the supply voltage and nominal drain-load resistance $R_o$ are chosen to deliver full output $V_{omPEP}$ at center point 90, then full output is also delivered for any drain impedance on contour 91. Along contour 92, the value of $R_D$ is quadrupled, hence the power output is quartered and the output voltage is half of the full output voltage. As the value of $R_D$ further increases, the output continues to decrease. When $R_D$ becomes infinite (contour 93), the output is reduced to zero.

"Efficiency" commonly refers to the ratio of RF power output to dc power input; i.e., $$\eta = P_o/P_i.$$

The maximum efficiency $\eta_{max}$ depends upon the type of PA and is generally highest when the PA is saturated or nearly saturated. The efficiency of most power amplifiers is degraded by the presence of reactance in the load. As shown in FIG. 11, the maximum efficiency for ideal class-A, -B, -C, and -F, PAs typically occurs along the pure-resistance line. Consequently, the preferred impedance locus for efficient amplitude modulation is the pure-resistance line 94 running from point 90 ($R_D=R_0$) for full output to point 95 ($R_D=\infty$) for zero output. The dots along line 94 show output-voltage steps of 10 percent.

The resulting variation of efficiency with output-signal amplitude is shown in FIG. 12 for selected ideal PAs. For a class-B PA in conventional linear operation, the efficiency degrades from 78.5 percent at full peak-envelope-power (PEP) output to zero at zero output, resulting in inefficient amplification of low-amplitude signals. For an electronically tuned class-B PA, the efficiency $\eta$ is constant at 78.5 percent at all amplitudes because the PA is always operating at peak voltage output (and optionally saturated). For ideal class-D, -E, and -F PAs, the efficiency of the electronically tuned PA remains at 100 percent for all output amplitudes. For signals with significant peak-to-average ratios (e.g., multiple carriers amplified simultaneously), the improvement in average efficiency can be very significant. (See "Average efficiency of power amplifiers," *Proc. RF Technology Expo '86*, Anaheim, Calif., pp. 474–486, Jan. 30–Feb. 1, 1986, by F. H. Raab.)

The efficiency of an ideal class-D PA is in theory not degraded by the presence of load reactance. Consequently, it is in principle possible to achieve efficient amplitude modulation of a class-D PA by varying the impedance along any path that changes the amplitude of the output. In practice, second-order loss effects will be reduced by using a locus close to the resistive locus 94 in FIG. 11.

Optimum operation of a class-E power amplifier requires that the drain voltage drop to zero and have zero slope at the time the active device turns on. This mode of operation is desirable as it offers 100-percent efficiency in an ideal amplifier and has good bandwidth and good tolerance of circuit variations. The requirements for this mode of operation are generally stated in terms of a capacitance shunting the active device and a series impedance loading the combination of the active device and shunt capacitance. See for example "Idealized operation of the class E tuned power amplifier" by F. H. Raab in *IEEE Trans. Circuits and Syst.*, vol. CAS-24, no. 12, pp. 725–735, December 1977.

FIG. 13 shows the basic circuit of an electronically tuned class-E power amplifier with optimum class-E operation. Electronically tuned filter 110 comprises an electronically variable shunt input capacitor 111 and one or more additional electronically variable elements in sub-network 113. Shunt capacitor 111 and subnetwork 113 are responsive to tuning signals 112 and 114, respectively. Electronically tuned subnetwork 113 has time-varying input impedance $Z_S$.

The conditions for optimum operation are conveniently stated (a) a drain-shunt capacitance with reactance $$X_C = 5.45 R_S$$

and series load impedance $$Z_S = R_S + j1.15 R_S.$$

Given these loading conditions, an ideal class-E PA is 100-percent efficiency and has a power output $0.577 V_{DD}^2 / R_S$. Shunt reactance $X_C$ is generally provided by a combination of the drain/collector capacitance and an optional additional capacitor.

The preferred impedance contours for efficient amplitude modulation with optimum operation of a class-E PA are shown in FIG. 14. The series load impedance is electronically varied along locus 122 on which the reactance is approximately 1.15 times the resistance. Full output is produced at $Z_S = R_0 + j1.15 R_0$ (121) and zero output at $Z_S = \infty$ (123). Simultaneously the shunt reactance $X_C$ is electronically varied along contour 125 from 5.45 $R_0$ (124) for full output to $\infty$ (126) for zero output. Variation of the series impedance and shunt reactance along these contours maintains optimum operation and ideally 100-percent efficiency for all signal levels.

Another approach to electronic tuning of a class-E power amplifier is shown in FIG. 15. Shunt capacitance 130 is fixed and may be provided in whole or in part by the capacitance inherent in the drain of the active device. Series inductance 131 is also fixed and may be provided in whole or in part by the bond wires and leads in the package of the active device. Electronically tuned filter 132 provides load impedance $Z_L$ to the amplifier and its fixed components. Advantageously, shunt capacitor 130 provides the shunt susceptance for optimum operation at full output power, series inductor 131 provides the series reactance of approximately 1.15 $R_0$ for optimum operation at full output power, and electronically tuned filter 132 provides a resistive load impedance of $R_0$ for optimum operation at full output power.

FIG. 16 shows the efficiency contours of this amplifier as functions of impedance $Z_L$. An efficiency of 100 percent is maintained along contour 136, which is a straight line inclined at an angle of approximately 65°. Optimum operation at nominal power occurs at nominal load $R_0$ (135). Power output decreases toward zero as $Z_L$ moves toward impedance 137. The preferred impedance locus for high-efficiency modulation is therefore the line 136 running from nominal load 135 for full output to point 137 for zero output. It is apparent that good efficiency can be maintained even with considerable deviation from the preferred locus. A more detailed explanation of the suboptimum class-E mode of operation can be found in "Suboptimum operation of class-E RF power amplifiers," *Proc. RF Technology Expo '89*, Santa Clara, Calif., pp. 85–98, Feb. 14–16, 1989 by F. H. Raab.

It must be recognized that these are only a few of many possible examples. In general, a load-pull analysis may be required to determine the power-output and efficiency of a real power amplifier as functions of load impedance. These characteristics are then used to determine the impedance locus that provides a suitable amplitude range with high efficiency.

Modulation with Drive and Bias Control

Electronically tunable components, like all other tunable components, have finite ranges of variation. Consequently, an electronically tuned filter can only be tuned over a finite range without switching elements. The range of impedances that an electronically tuned filter can produce in turn limits the range of amplitude modulation that it can produce. However, many applications require production of signals with amplitudes that range from full PEP output down to essentially zero output. For example, the envelope 85 of the two-tone waveform in FIG. 9 drops to zero at some points.

The embodiment shown in FIG. 17 overcomes this limitation by controlling the drive level in addition to the filter impedance. Drive input 12 is coupled to an amplitude-control device 140 such as a diode-ring modulator or dual-gate MOSFET. Drive level can also be controlled during signal generation by a digital signal processor. Amplitude-control device 140 varies the amplitude of its output 141 in response to drive-control signal 142. The output of amplitude-control device 140 is coupled to the input of power amplifier 10. Optionally, intermediate amplifiers and/or frequency translators can be inserted in this path. The output of PA 10 is coupled to electronically tuned filter 11, which is responsive to control signal 15. The output of 18 of filter 11 is coupled to the load 19 for delivery of RF power.

For larger output amplitudes, electronically tuned filter 11 varies the load impedance $Z_L$ presented to power amplifier 11 to control the output signal amplitude. In this range of amplitudes, the drive amplitude may be held constant or varied to conserve drive power. For smaller amplitudes, electronically tuned network 11 is set by control signal 15 to produce the minimum output signal amplitude. Drive control signal 142 then causes the amplitude-control device 140 to vary the drive amplitude so as to produce the desired output amplitude. The transition between the two ranges in amplitudes occurs when the electronically tuned filter is at the end of its range and can not further the output amplitude without sacrificing linearity or efficiency. Efficiency remains high over most of the dynamic range, as shown by curve 103 in FIG. 12.

The variation shown in FIG. 18 adds a controller 61 to the embodiment of FIG. 17. Controller 61 uses analog functions, a digital look-up table, or other suitable means to translate modulation input 60 into a suitable drive-control signal 142 and filter-control signal 15. It should be noted for some amplifiers, explicit drive control is not needed. When power amplifier 10 is producing a lower output, it generally requires a lower drive amplitude, hence the natural variation of the amplitude in an unlimited drive signal may suffice to extend the dynamic range of the electronically tuned PA to zero.

A power amplifier such as class A that uses fixed bias (hence fixed dc quiescent current) can dissipate a large amount of power when its signal output is small. The variation shown in FIG. 19 reduces this dissipation by controlling the bias to the gate, base, or grid. Basically, bias 143 is adjusted to vary the quiescent current roughly in proportion to the signal level. This causes the power dissipation to vary with signal level, thus maintaining a roughly constant efficiency. As shown in FIG. 19, controller 61 may also be used to translate signal amplitude into the desired bias. Obviously, controller 61 may simultaneously control the drive amplitude 142, PA bias 143, and tuning 15. The bias level 143 can also be supplied by an external source. This concept can be extended to include variation of the drain/collector bias (supply voltage) as well.

Multiple Power Amplifiers

Electronically tuned power amplifiers can also be used to advantage when the outputs of a plurality of power amplifiers must be combined and the output signals from each delivered to the same load. Two of many possible examples are diplexing and outphasing, which are described below.

The outputs of two or more power amplifiers must often be combined. The PAs may operate on the same or different frequencies. Systems that combine outputs PAs operating on the same frequency are known as "power combiners." Systems that combine the outputs of a plurality of PAs that operate on different frequencies are known as "diplexers" (two PAs) or "multiplexers" (more than two PAs). In some applications, one PA may be preferred for generating lower frequencies, while the other is favored for generating higher frequencies. In other applications, all PAs must be able to transmit on any frequency within a common band. Problems occur in conventional fixed-component systems for several reasons. Signals that are not matched in phase and frequency produce reactive loads for the amplifiers, resulting in inefficient operation. Diplexer/multiplexer filters interact, resulting in reactive load impedances for the amplifiers, variations in the frequency response, and a dead space between the bands into which little or no signal can be delivered. Fixed-component systems are inherently incapable of adjusting to changing transmitting frequencies.

FIG. 20 depicts a diplexing arrangement whereby the outputs of two electronically tuned PAs are combined. A first signal 150 is coupled to PA 151 which is in turn coupled to electronically tuned filter 152 which is responsive to control signal 153. Similarly, second signal 154 is coupled to PA 155 which is in turn coupled to electronically tuned filter 156 which is responsive to control signal 157. The outputs of filters 152 and 156 are coupled to combiner 158 to produce combined output 159 containing amplified replicas of both input signals 150 and 154. Combiner 159 may be a transformer, hybrid power combiner, or other suitable device. Control signals 153 and 157 cause the corresponding filters to compensate for variations in load impedance and amplitude resulting from combining the two output signals into the same load. The control signals are dynamically readjusted to maintain proper operation as signal amplitude and frequency change. This eliminates inefficiency due to mismatched loads at the power amplifiers and losses in the combiner associated with combining signals of different amplitudes and phases.

The outphasing technique combines the outputs of two PAs driven with signals of different phases. The amplitude of the combined output varies in response to variations in the phases of the two driving signals. For example, the system produces full output when both phases are identical and zero output when they are 180° apart. A disadvantage is that the PAs are presented with reactive loads at intermediate amplitudes, resulting in inefficient operation. The variation attributable to Chireix partially overcomes this limitation by cancelling the reactance at one intermediate amplitude. However, reactive PA loads remain present at other output amplitudes, resulting in inefficiency. A detailed explanation can be found in "Efficiency of outphasing power-amplifier systems," *IEEE Trans. Commun.*, vol. COM-33, no. 10, pp. 1094–1099, October 1985, by F. H. Raab.

FIG. 21 depicts an outphasing transmitter based upon electronically tuned power amplifiers. Input 160 causes controller 161 to generate variable-phase drive signals 162 and 163 and filter-tuning signals 164 and 165. Variable-phase drive signal 162 is coupled to PA 166, which is in turn coupled to electronically tuned filter 168. Variable-phase drive signal 163 is similarly coupled to PA 167, which is in turn coupled to electronically tuned filter 169. Electronically tuned filters 168 and 169 may be as simple as single variable capacitors or inductors. The outputs of electronically tuned filters 168 and 169 are combined by combiner 170 to produce output 171. At any given amplitude, combiner 170 may present the electronically tuned filters 168 and 169 with reactance as well as resistance. Control signals 164 and 165 cause the filters to tune to cancel the reactances, allowing PAs 166 and 167 to operate with maximum efficiency.

It will be apparent to those skilled in the art that various features of these particular embodiments can be combined to form additional embodiments. Wide varieties of choices exist for the active devices, topologies, and electronically tuned elements. The amplifiers can be of any suitable type for the frequency range and power level. Kahn or other high-efficiency amplification techniques can be used in any of the embodiments. Class-S modulators and/or switching regulators can be added to reduce the dc supply voltage to the minimum needed, thereby maintaining high efficiency. All of the embodiments shown can be used advantageously in combination with fixed filters for additional suppression of unwanted signals such as harmonics.

BRIEF DESCRIPTION OF THE DRAWINGS

The novel features believed characteristic of the invention are set forth in the appended claims. The invention itself however, as well as a preferred mode of use and further objects and advantages thereof, will best be understood by reference to the following detailed description of an illustrative embodiment when read in conjunction with the accompanying drawings, wherein:

NOMENCLATURE AND DEFINITIONS

Figure 1:
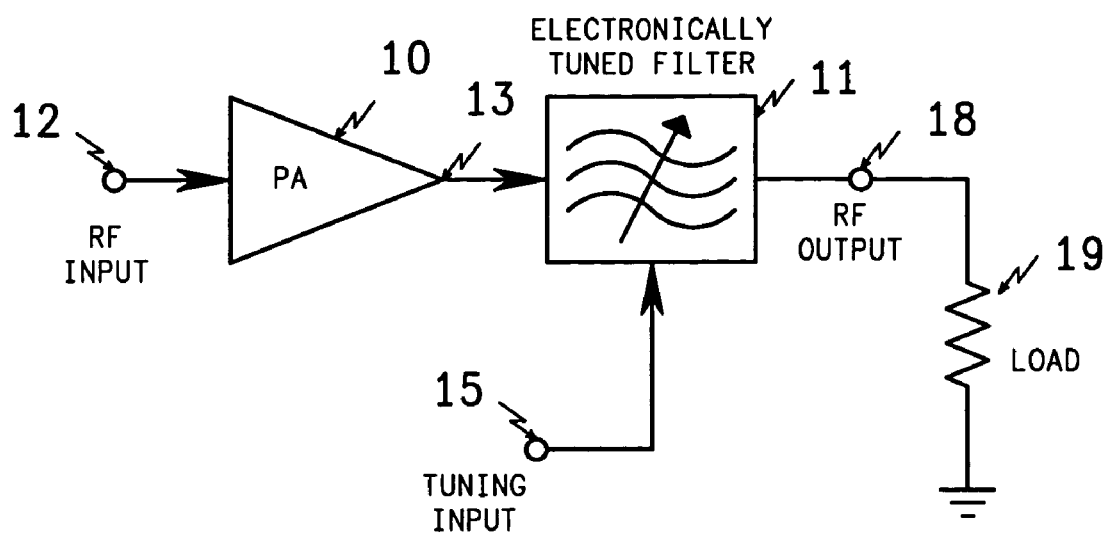
FIG. 1 depicts a power amplifier delivering power to a load through an electronically tuned filter.
Figure 2:
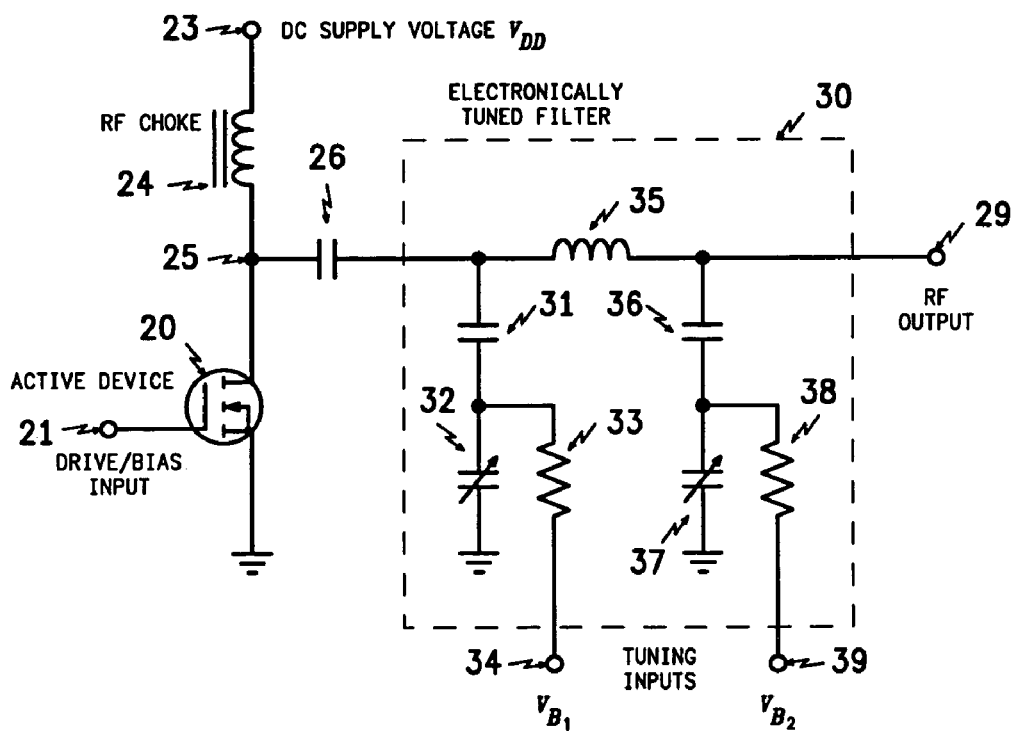
FIG. 2 illustrates an electronically tuned power amplifier in which the electronically tunable elements are electronically variable capacitors.
Figure 3:
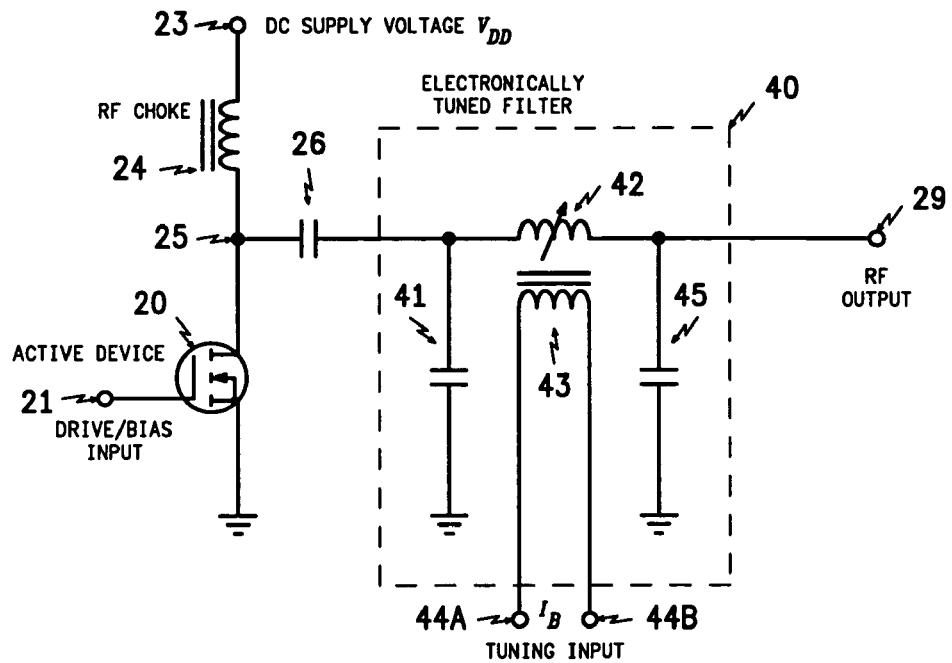
FIG. 3 illustrates an electronically tuned power amplifier in which the electronically tunable elements are electronically variable inductors.
Figure 4:
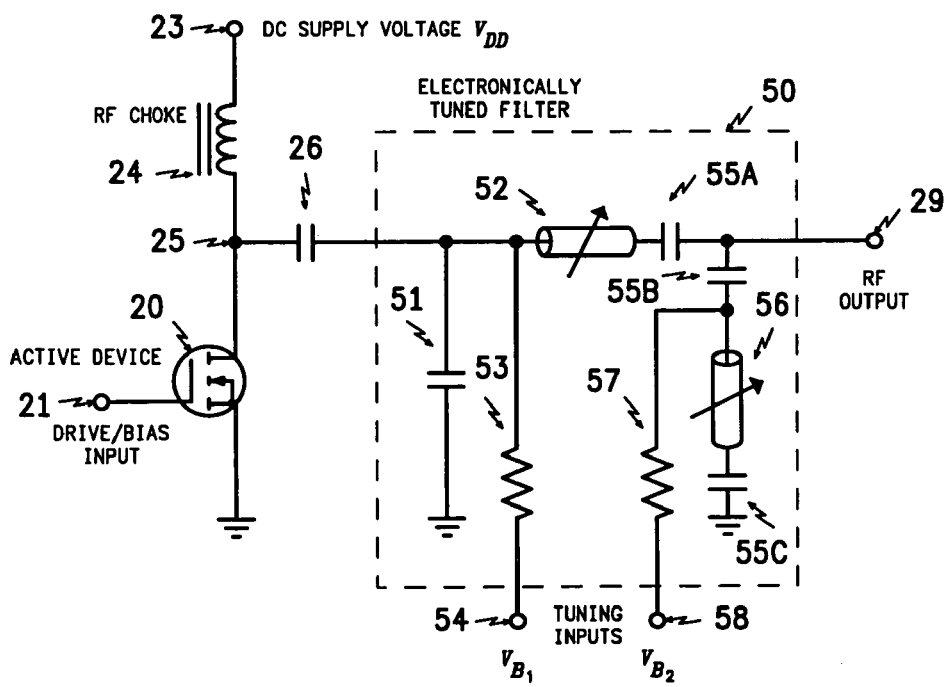
FIG. 4 illustrates an electronically tuned power amplifier in which the electronically tunable elements are electronically variable transmission lines.
Figure 5:
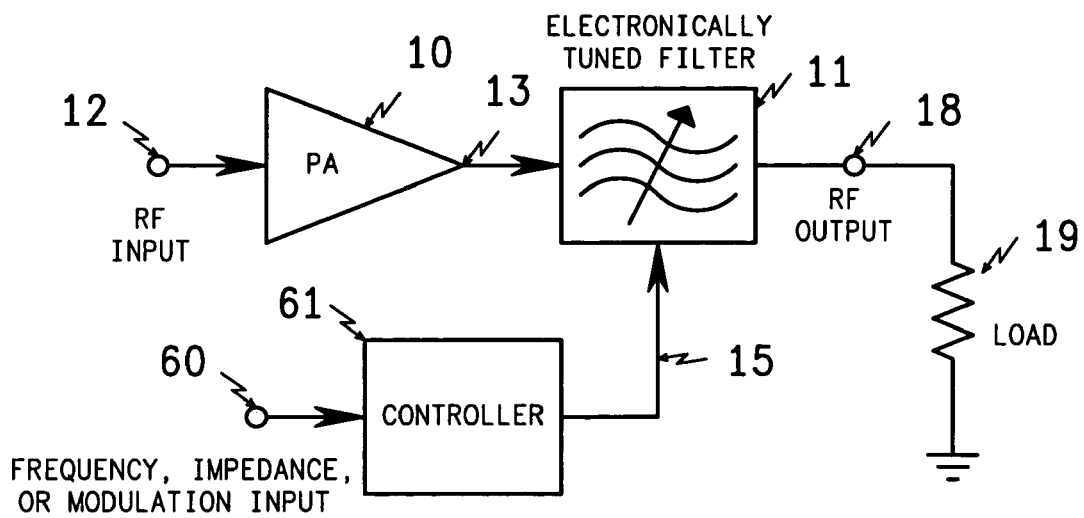
FIG. 5 depicts an electronically tuned power amplifier with a controller for translating the desired frequency, impedance, or modulation into control signals suitable for the electronically variable elements.
Figure 6:
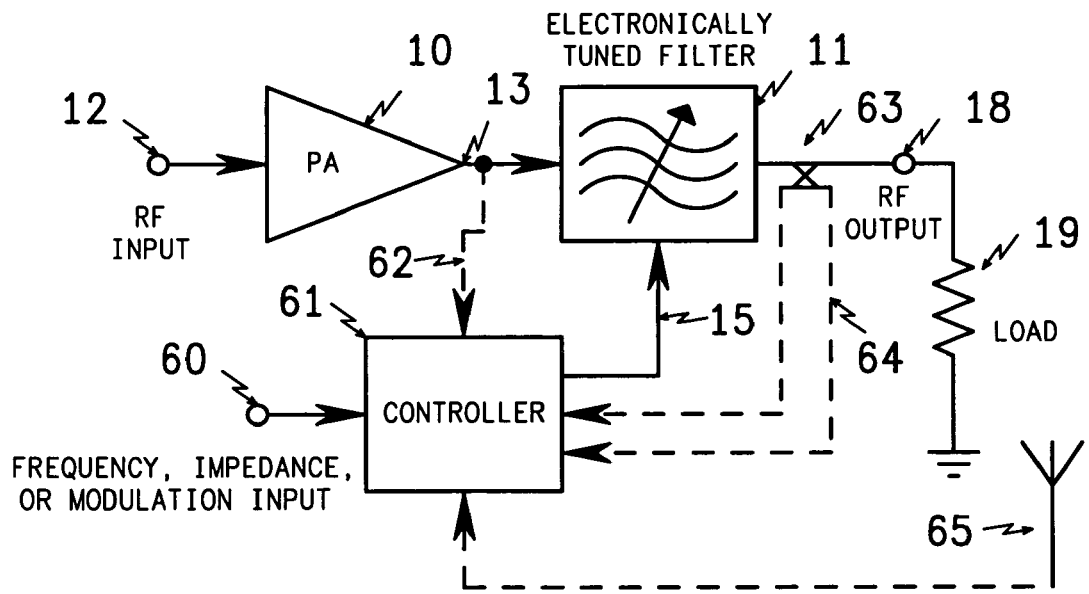
FIG. 6 depicts an electronically tuned power amplifier with a controller that uses feedback to obtain proper tuning of the electronically variable elements.
Figure 7:
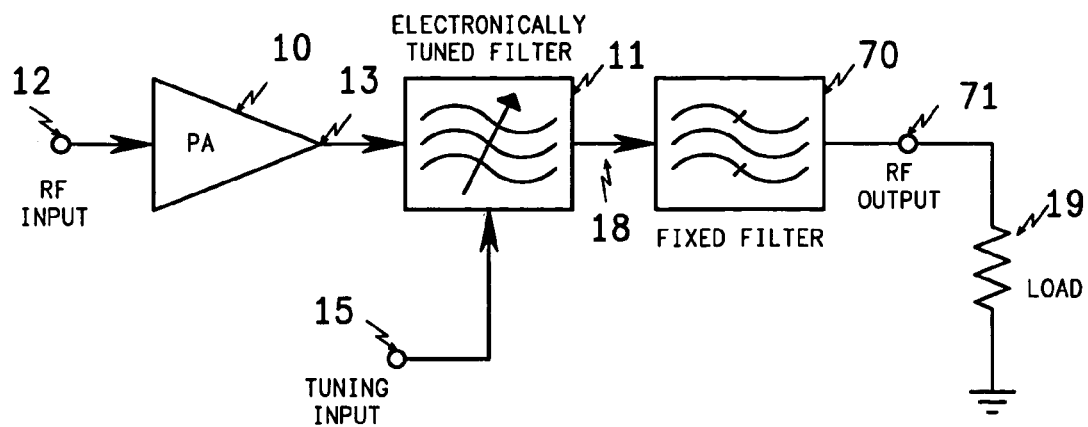
FIG. 7 illustrates the addition of a conventional fixed filter for suppression of harmonics in the output of the electronically tuned filter.
Figure 8:
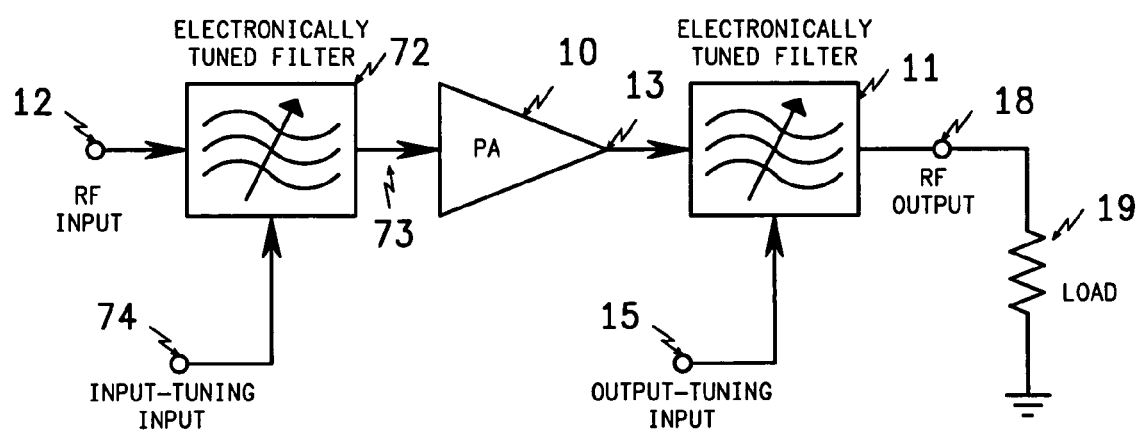
FIG. 8 depicts the use of electronically tuned filters at both the input and output of the power amplifier.
Figure 9:
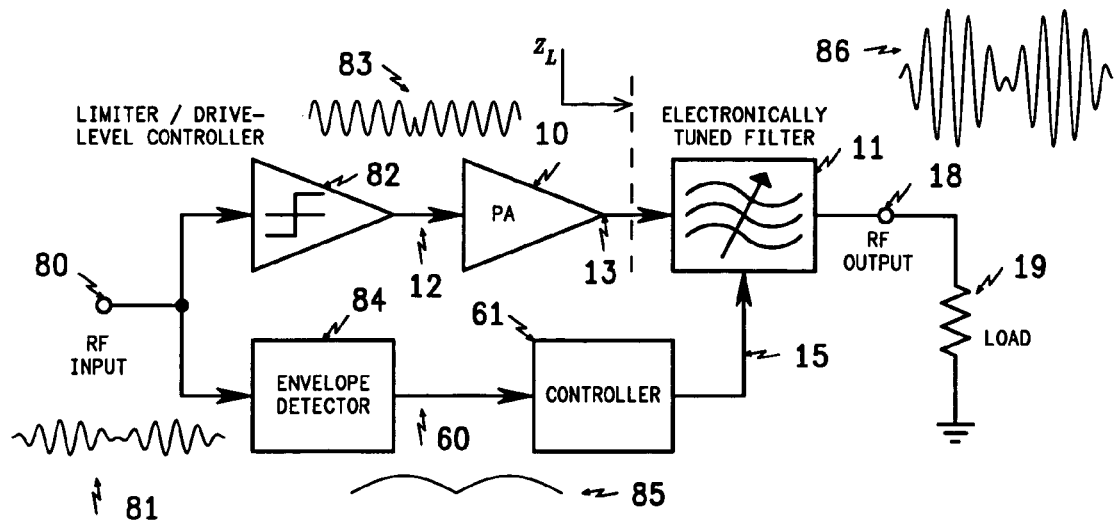
FIG. 9 depicts a block diagram for using an electronically tuned power amplifier for the production of complex signals having amplitude modulation, phase modulation, or both.
Figure 10:
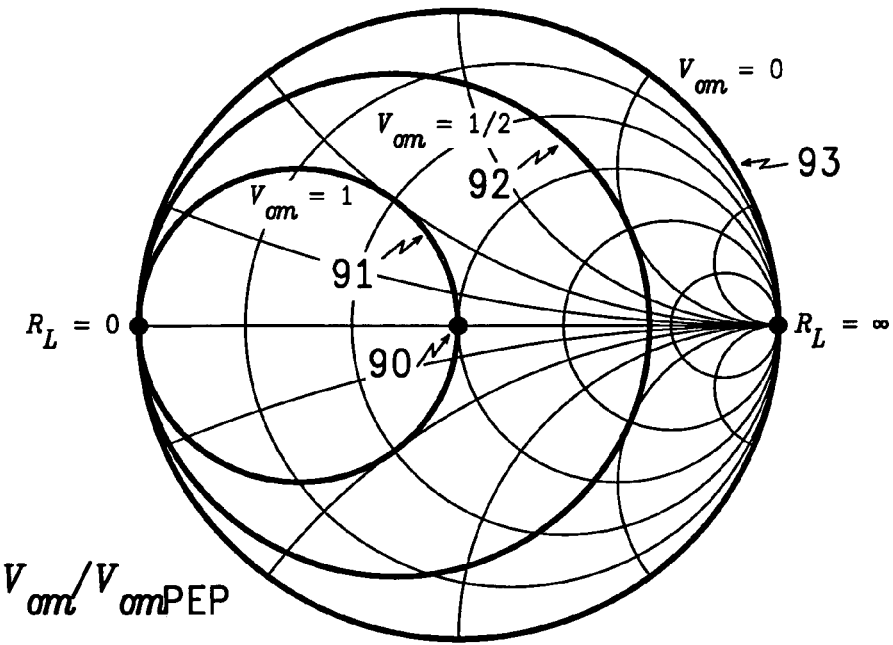
FIG. 10 depicts constant-output contours for class-A, -B, -C, and -F PAs in Smith-chart format.
Figure 11:
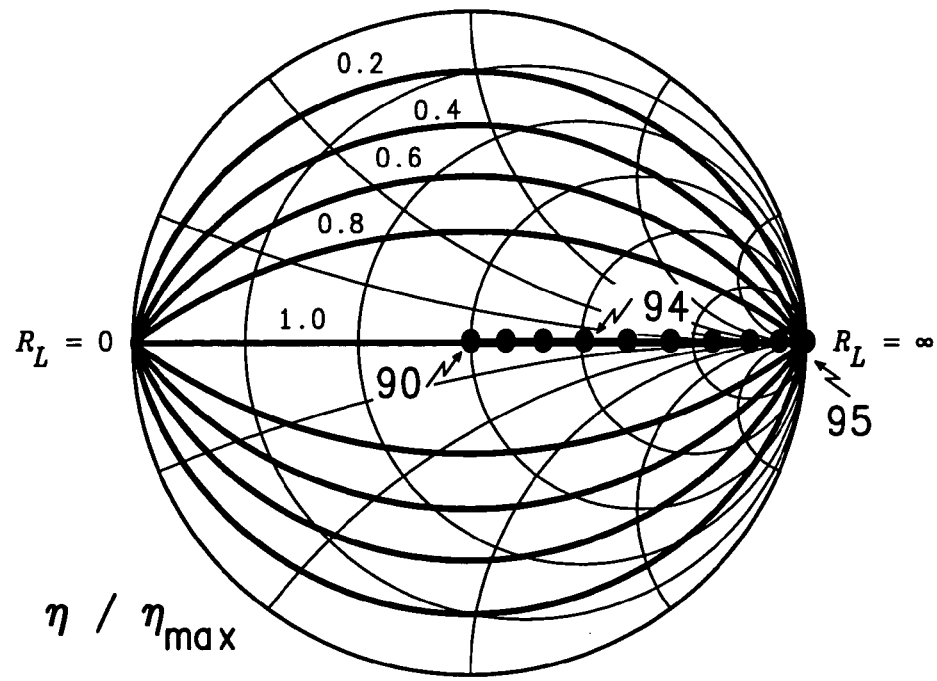
FIG. 11 depicts efficiency contours and the preferred impedance locus for efficient amplitude modulation of electronically tunable class-A, -B, -C, -D, and -F PAs.
Figure 12:
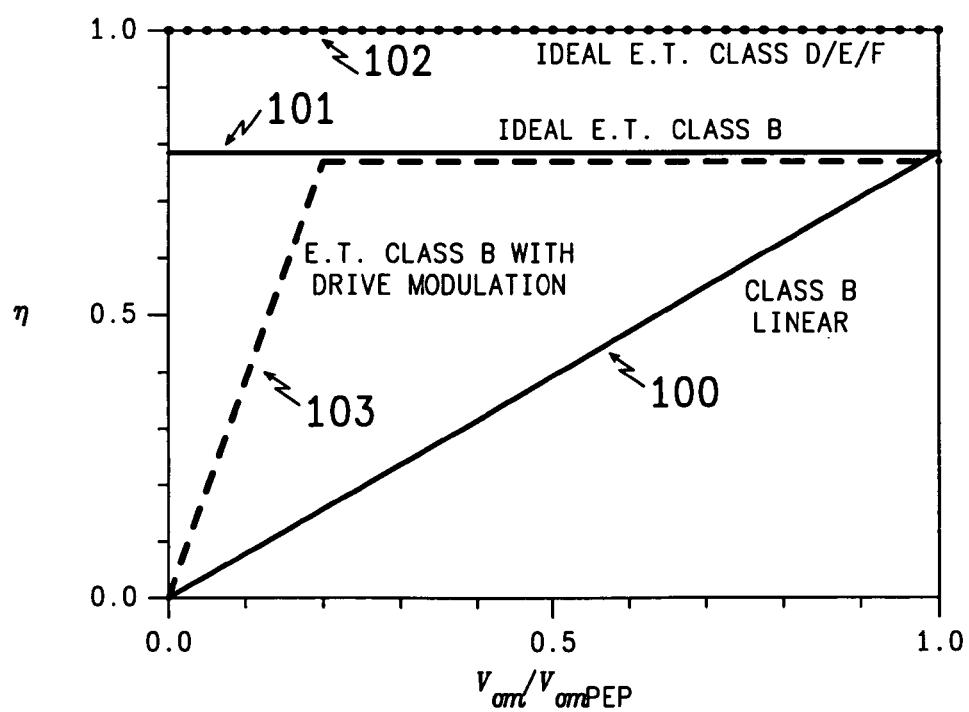
FIG. 12 illustrates the variation of the efficiency of an electronically tunable power amplifier with output voltage, and contrasts it to that of linear power amplifiers.

In this specification and the appended claims, the term "power amplifier" is used to mean an amplifier operated in a large-signal mode in which its RF-output power is an appreciable fraction of its dc-input power. Amplifiers operating in other than class A (e.g., classes B, C, D, E, F, G, and S, as well as hybrid combinations and intermediate classes) are inherently classified as power amplifiers because they employ techniques other than simple linear amplification. These techniques include operation of the active device in more than one region (cut-off, active, saturated, inverse), saturated operation during part of the RF cycle, operation as a switch, time-varying quiescent current, and the use of output filters with resonators for harmonic frequencies. Class-A power amplifiers are distinguished from small-signal amplifiers by operation such that the peak output-signal power is more than one tenth of the saturated output power. This conforms to the meaning conventionally understood by those skilled in the art, in which the term "power amplifier" is commonly used to distinguish such amplifiers from "small-signal" amplifiers.

"Efficiency," "drain efficiency," "collector efficiency," or "dc-to-RF conversion efficiency" refers to the ratio of RF power output to dc power input; i.e., $$\eta = P_o/P_i.$$

Other commonly used definitions of efficiency are "power-added efficiency" and "overall efficiency." "Power-added efficiency" is the ratio of output power less drive power to dc-input power. "Overall efficiency" is the ratio of output power to dc-input power plus drive power. All three efficiencies and others can be optimized by use of the invention.

"Amplitude modulation" refers to variation of signal amplitude over time to convey information such as sound or data. "Phase modulation" similarly refers to variation of signal phase over time, and as used herein includes frequency modulation. "Complex modulation" refers to simultaneous amplitude and phase modulations.

"RF" or "Radio Frequency" as used herein refers to any alternating-current (ac) signal, voltage, current, or frequency.

"Blocking capacitor" refers to a capacitor that passes RF voltage and current signals but blocks the passage of dc voltages and currents. A "bypass capacitor" is similarly used to divert RF signals (usually to ground) without passing dc. "RF choke" refers to an inductor that passes dc voltage and current while blocking the passage of RF current and voltage.

The terms "electronically tunable filter" or "electronically tunable network" as used interchangeably herein refer to an electronic circuit that includes at least one electronically variable reactive element.

The term "electronically variable reactive element" refers to any circuit element or component whose electrical reactance can be varied continuously over some range in response to electrical, magnetic, optical (photonic), or other nonmechanical stimulus.

The terms "reactive element" and "tuning element" refers to any circuit element or component whose electrical impedance is substantially reactive. Included are capacitors, inductors, and transmission lines, as well as any other elements that exhibit similar characteristics.

A "digital signal processor" is a circuit or combination of circuits that performs signal processing through digital techniques. As used herein, the "digital signal processor" includes analog-to-digital converters, digital-to-analog converters, memory, and other components as are required to produce the desired functionality.

A "diplexer" is a system for combining the signals from two different sources (e.g., amplifiers) into a single load (e.g., antenna). A "multiplexer" is a system for combining the signals from two or more different sources into a single load.

A "load sensor" is any device (e.g., directional coupler, SWR bridge, voltage probe, current probe) capable of measuring the characteristics (e.g., SWR, impedance) of the load. As used herein, the "load sensor" includes supporting apparatus such as analog-to-digital converters, rectifiers, filters, and other components required to produce the desired functionality.

An "RF sampler" is any device capable of obtaining a sample of the RF signal. A "sample" of the output can be voltage, current, forward power, reflected power, electric field, magnetic field, or any other suitable indicator of delivery of the signal to the load.

The term "network" as used herein refers to an electronic circuit comprising components such as inductors, capacitors, resistors, transformers, transmission lines, and the like.

BEST MODE FOR CARRYING OUT THE INVENTION

Figure 22:
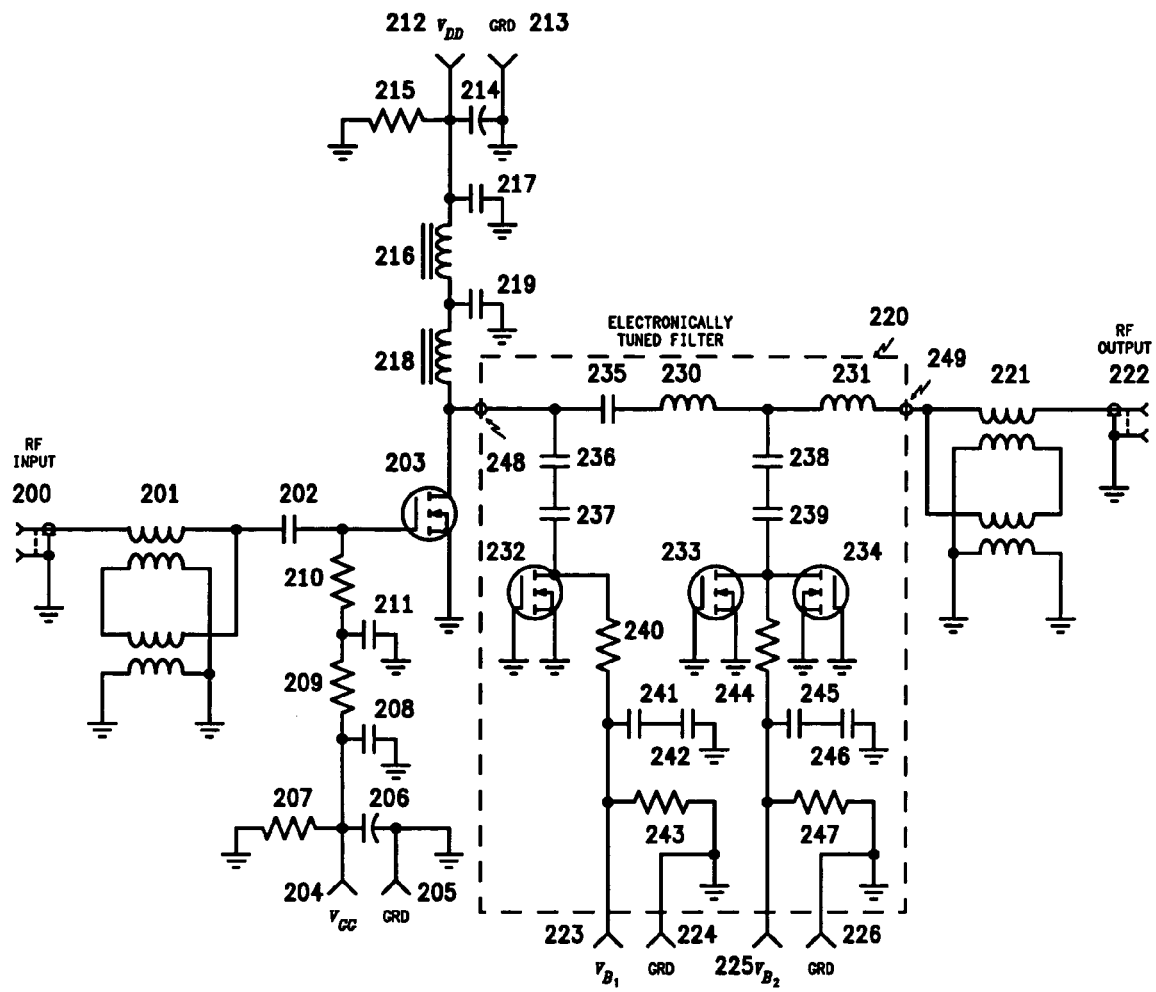
FIG. 22 shows the circuit of the preferred embodiment in which capacitors are the only electronically tunable devices.

FIG. 22 presents the circuit of an embodiment of the invention that uses class-E power amplification and two electronically variable capacitances.

RF drive is applied at input 200, which is coupled to transformer 201. Transformer 201 is preferably an equal-delay (Guanella) type for maximum bandwidth. Its output is coupled by blocking capacitor 202 to the gate of active device 203, which is an RF-power MOSFET. Gate-swamping resistor 210 provides a resistive load to transformer 201 and thereby also to the driving signal.

Gate bias is applied at terminals 204 and 205. Terminal 205 is grounded. Resistors 209 and 210 are connected in series between terminal 204 and the gate of MOSFET 203 and provide a path for bias to reach the gate. Resistor 209 has a resistance large enough to block passage of the RF signal into the bias terminal. Capacitors 208 and 211 bypass RF signals to ground. Resistor 207 serves as a static drain and discharges capacitors 208 and 211 when the circuit is not in use.

The applied drive and bias preferably cause MOSFET 203 to act as a high-speed switch, as is desired for efficient class-E amplification. The bias preferably causes the MOSFET to be just below the verge of conduction. The driving signal is preferably sufficient to cause the MOSFET to toggle rapidly between cut-off (open-circuit) and saturated (low-resistance) states.

Dc power is supplied through terminals 212 and 213. Terminal 213 is grounded. Dc supply voltage $V_{DD}$ is coupled to the drain of MOSFET 203 through RF chokes 216 and 218. Capacitors 214, 217, and 219 bypass RF signals and power-supply noise to ground. Resistor 215 serves as a static drain and discharges capacitors 214, 217 and 219 when the circuit is not in use.

The drain of MOSFET 203 is coupled to the RF input of electronically tuned filter 220. The output 249 of electronically tuned filter 220 is coupled to transformer 221, which is in turn coupled to output 222. Transformer 221 is preferably of the equal-delay type for maximum bandwidth. A first tuning signal is applied to filter 220 through terminals 223 and 224. A second tuning signal is applied to filter 220 through terminals 225 and 226.

An electronically variable drain-shunt capacitance for near-optimum class-E operation is provided by the drain-source and drain-gate capacitances of MOSFET 232. The RF input 248 of the electronically tuned filter is coupled to the drain of MOSFET 232 through blocking capacitors 236 and 237, which are series-connected to provide sufficient break-down voltage. The gate and source of MOSFET 232 are connected to ground.

A bias voltage for varying the capacitance of MOSFET 232 is coupled to its drain through resistor 240, which is connected to bias input 223. Corresponding bias input 224 is connected to ground. Capacitors 241 and 242 are connected between bias input 224 and ground for RF bypassing. Resistor 243 provides for discharge of the capacitors.

Figure 13:
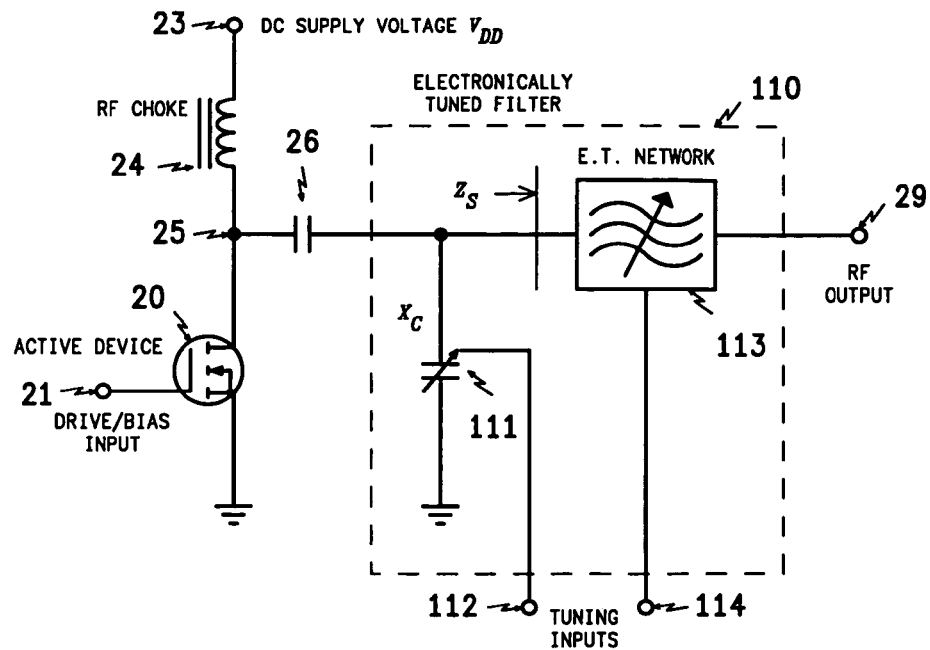
FIG. 13 presents the circuit of an electronically tuned class-E power amplifier capable of maintaining optimum operation during amplitude modulation.
Figure 14:
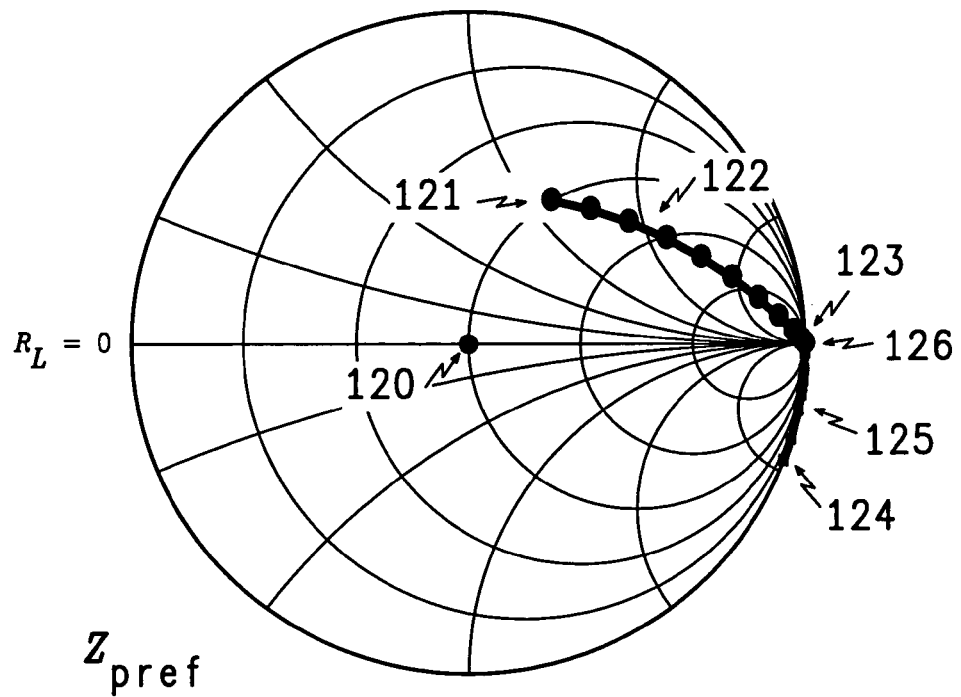
FIG. 14 depicts efficiency contours and the preferred impedance locus for efficient amplitude modulation of the electronically tuned power amplifier operating in optimum class-E PA.
Figure 15:
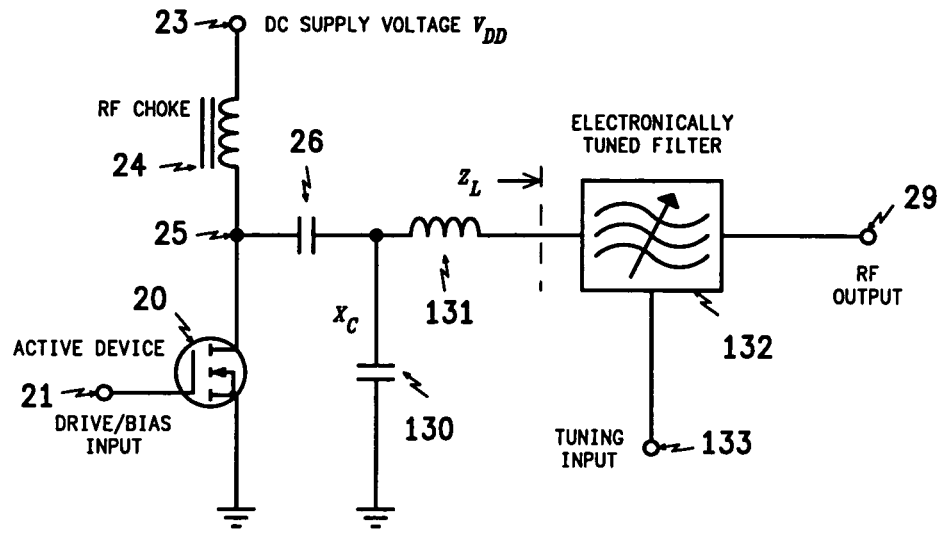
FIG. 15 illustrates the circuit of an electronically tuned power amplifier that operates in suboptimum class-E during amplitude modulation.
Figure 16:
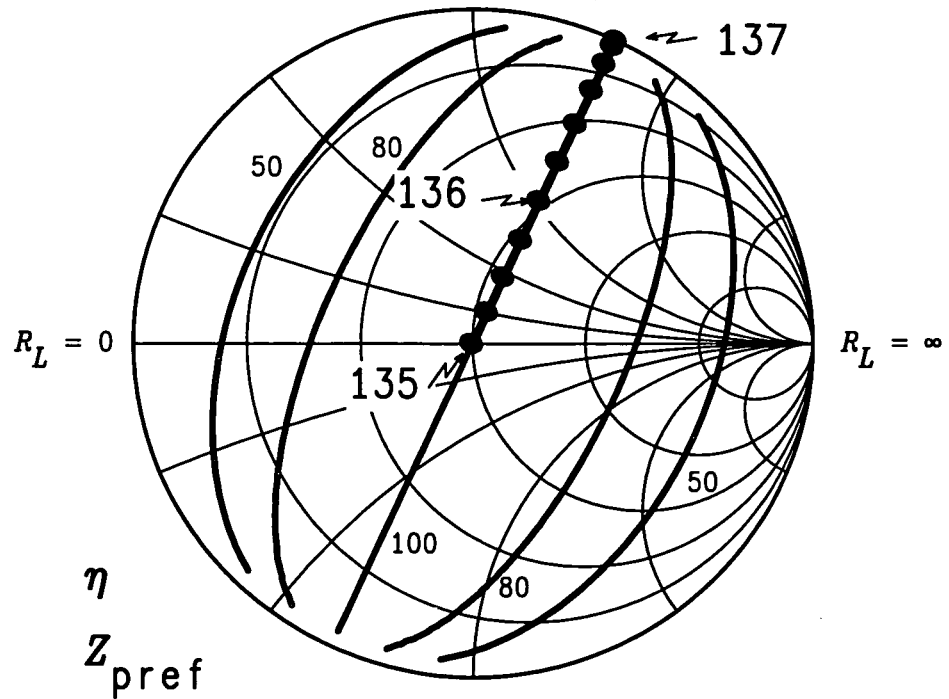
FIG. 16 depicts efficiency contours and the preferred impedance locus for efficient amplitude modulation of the electronically tuned power amplifier operating in suboptimum class E.
Figure 17:
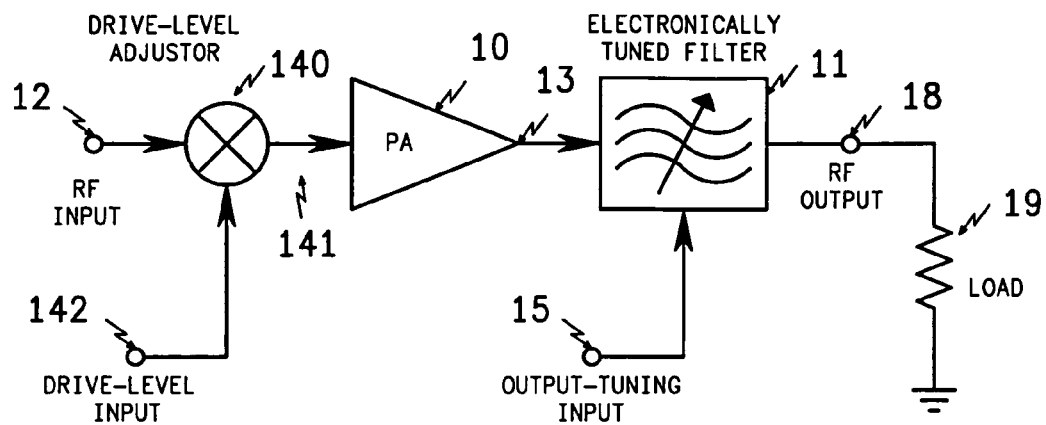
FIG. 17 illustrates the use of both drive-amplitude control and an electronically tuned output filter to achieve high efficiency and high dynamic range.
Figure 18:
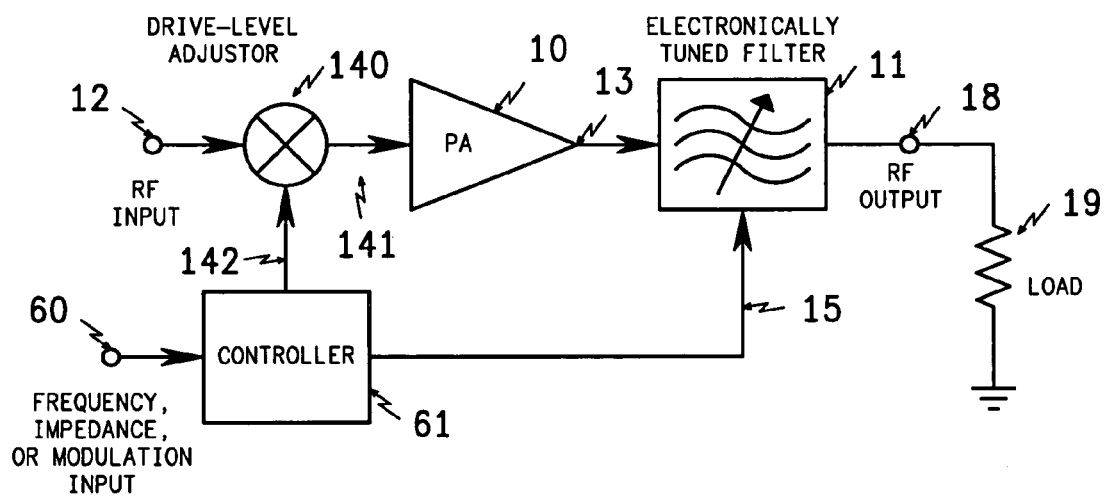
FIG. 18 depicts the addition of a controller to the electronically tuned PA of FIG. 17.
Figure 19:
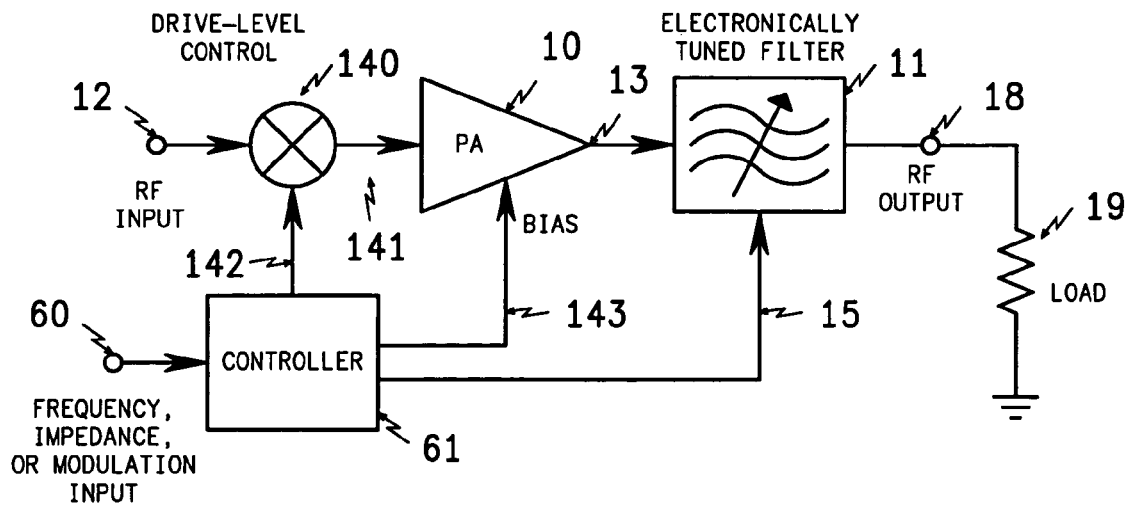
FIG. 19 depicts the use of bias modulation to improve the efficiency of the electronically tunable PA.
Figure 20:
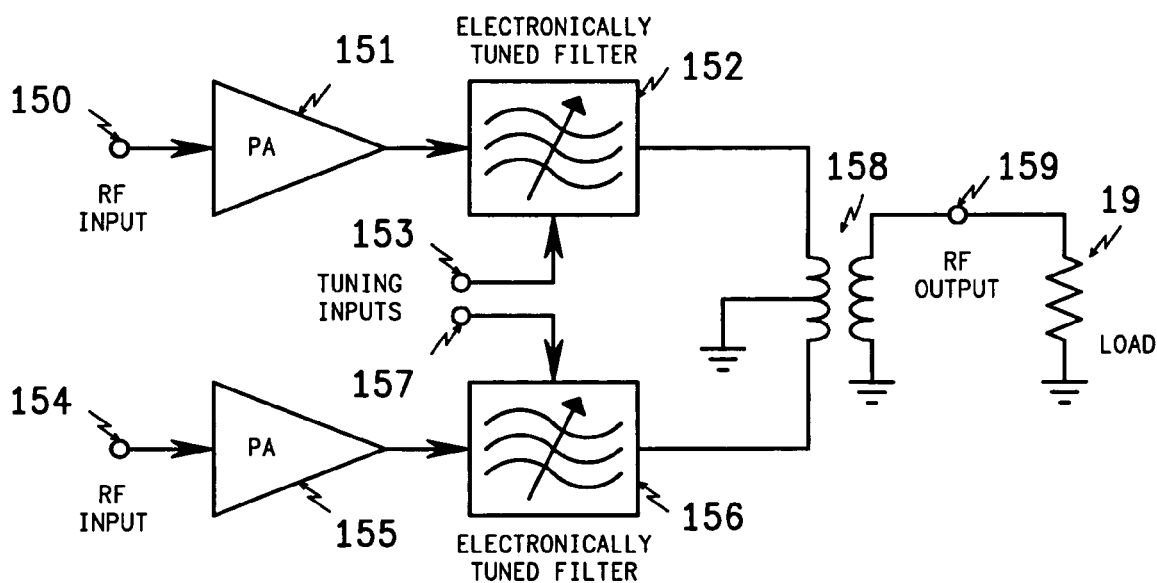
FIG. 20 depicts a diplexing system in which the outputs of two electronically tuned PAs are combined to deliver power into a common load.
Figure 21:
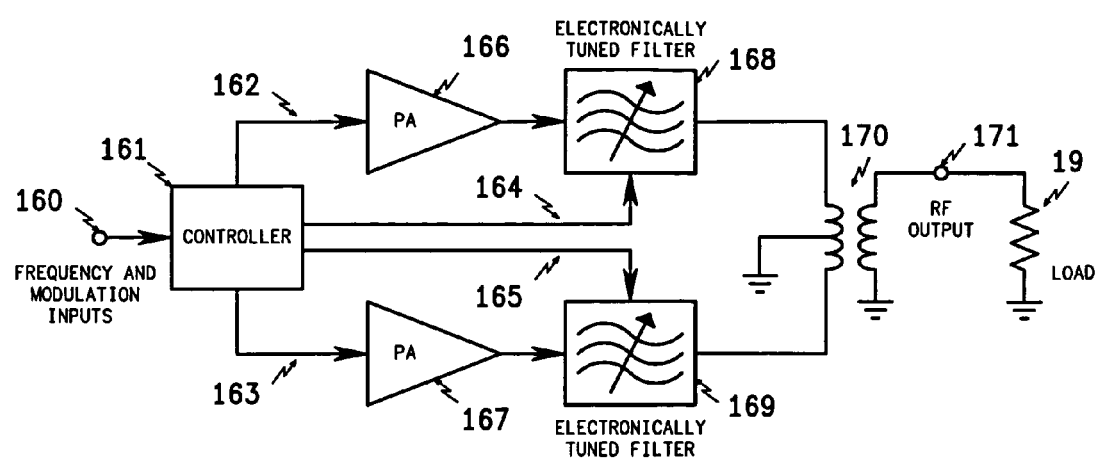
FIG. 21 depicts the use of electronically tuned power amplifiers for boosting the efficiency of an outphasing transmitter.

The output tuning network (analogous to electronically tuned subnetwork 113 in FIG. 13) is a "T" network comprising fixed tuning inductors 230 and 231 and an electronically variable capacitance provided by MOSFETs 233 and 234. The "T" network can be regarded as two back-to-back "L" networks that step the load impedance up and then back down to its original value when tuned. Tuning can thus be accomplished by variation of a single capacitance. In this case, two MOSFETs are connected in parallel to provide the proper values and range of capacitance, but the number used will depend upon the application. At mid band, the reactance of inductor 230 is larger than that of inductor 231 by approximately 1.15 times the load resistance. The filter thus provides the load impedance for optimum class-E at mid band and can be adjusted to provide a good approximation of this impedance at other frequencies.

The RF drain voltage from filter RF input 248 is coupled through blocking capacitor 235 to first tuning inductor 230. First tuning inductor 230 is coupled to second tuning inductor 231, which is coupled to the filter output 249. The common connection point between inductors 231 and 232 is coupled by blocking capacitors 235 and 236 to the drains of MOSFETs 233 and 234. The gates and sources of MOSFETs 233 and 234 are connected to ground.

A bias voltage for varying the capacitance of MOSFETs 233 and 234 is coupled to their drains through resistor 244, which is connected to bias input 225. Corresponding bias input 226 is connected to ground. Capacitors 245 and 246 are connected in series between bias input 225 and ground for RF bypassing. Resistor 247 provides for discharge of the capacitors.

Figure 23:
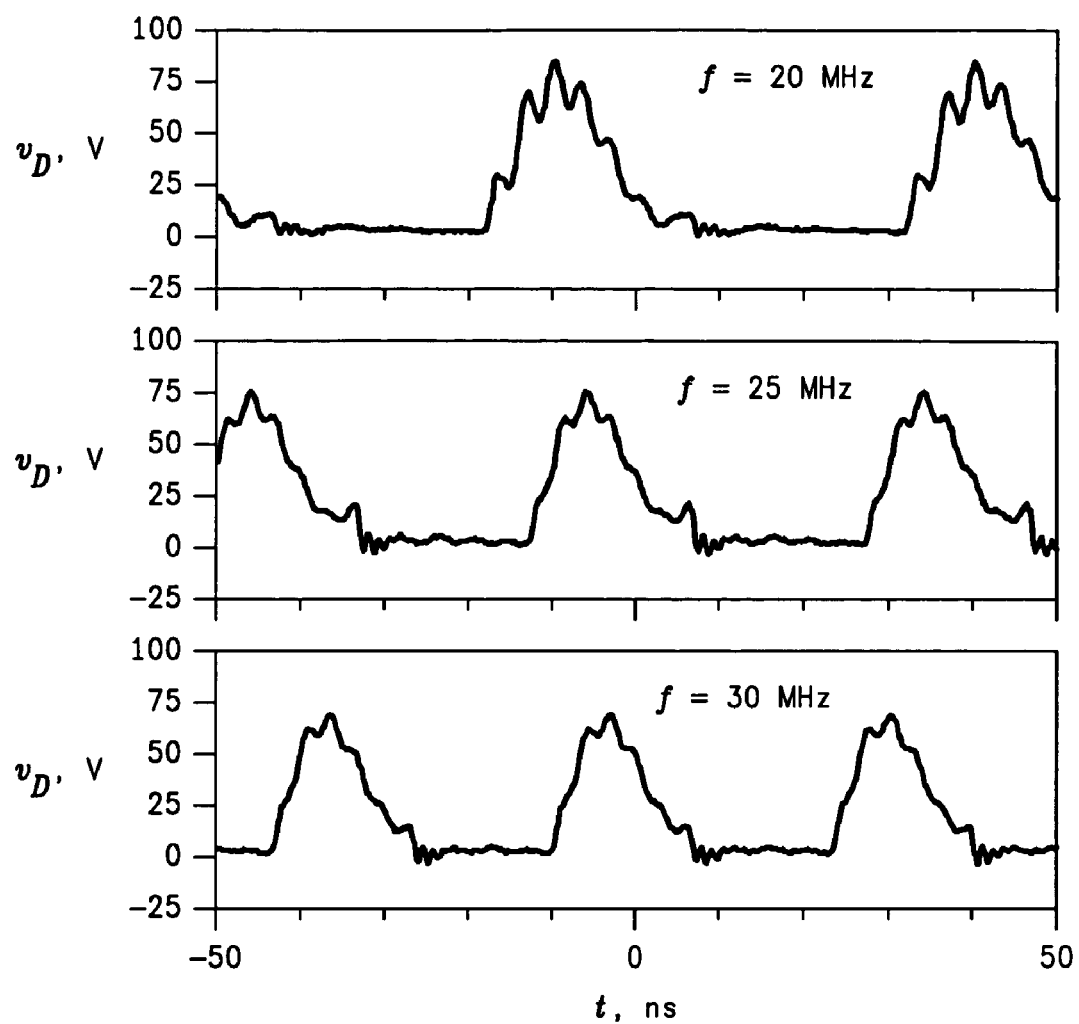
FIG. 23 shows drain-voltage waveforms characteristic of class-E operation observed at low, middle, and high frequencies.

FIG. 23 shows the drain-voltage waveforms observed when the amplifier is tuned to three significantly different frequencies. The high-frequency ripple is due to ringing of leads. When this is removed, the waveforms closely approximate those of optimum class-E operation.

Figure 24:
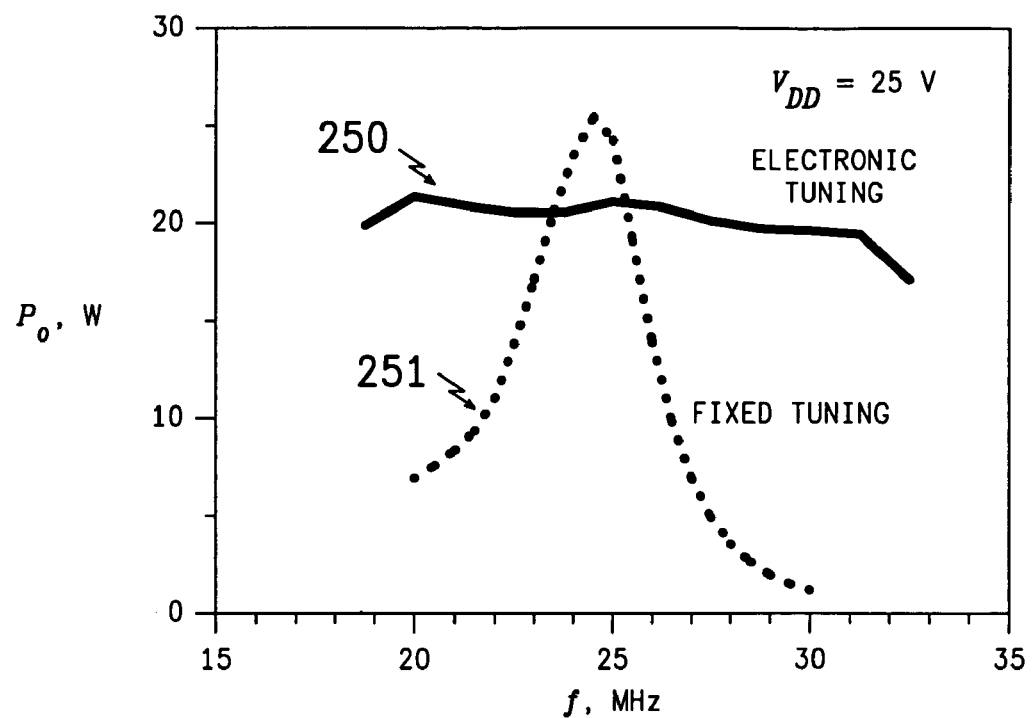
FIG. 24 presents the measured variations of output power and efficiency of the electronically tunable power amplifier over the band of operation, and contrasts them with those for a fixed tuned power amplifier.
Figure 24:
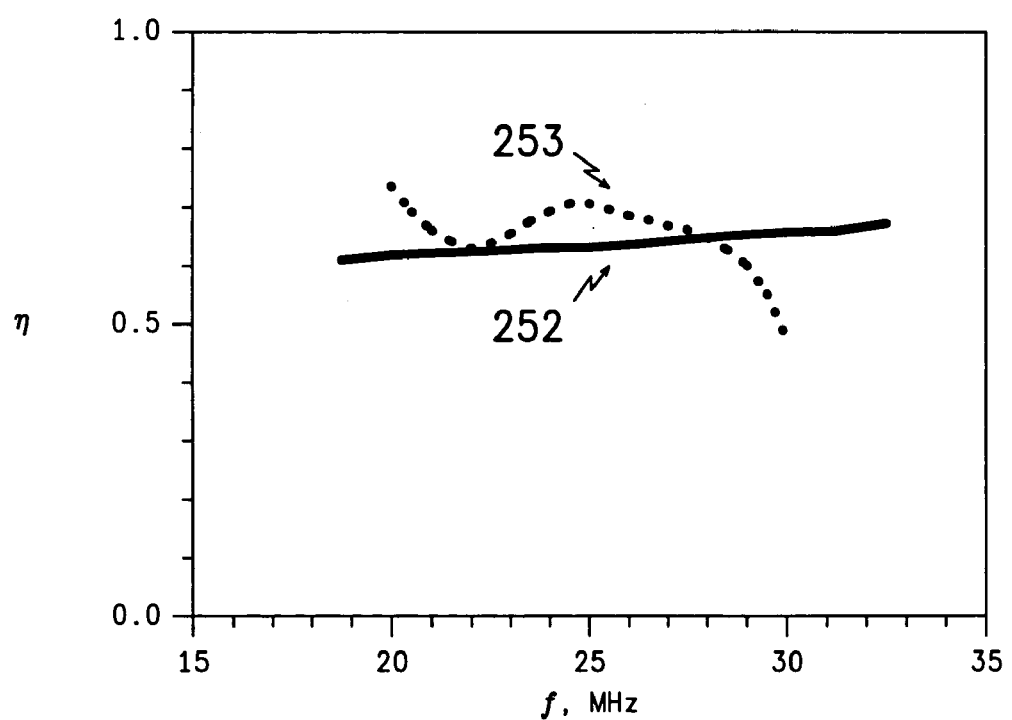

The variation with frequency of the power output and efficiency of the electronically tuned PA are shown in FIG. 24. The power output 250 is nearly constant at 20 W from 19 MHz to 31 MHz. In contrast, the power output 251 of a fixed-tuned class-E PA falls off rapidly as the frequency moves away from the one for which it is tuned, clearly demonstrating the utility of the electronically tuned PA. The efficiency 252 of the electronically tuned PA remains relatively constant between 62 and 67 percent.

Figure 25:
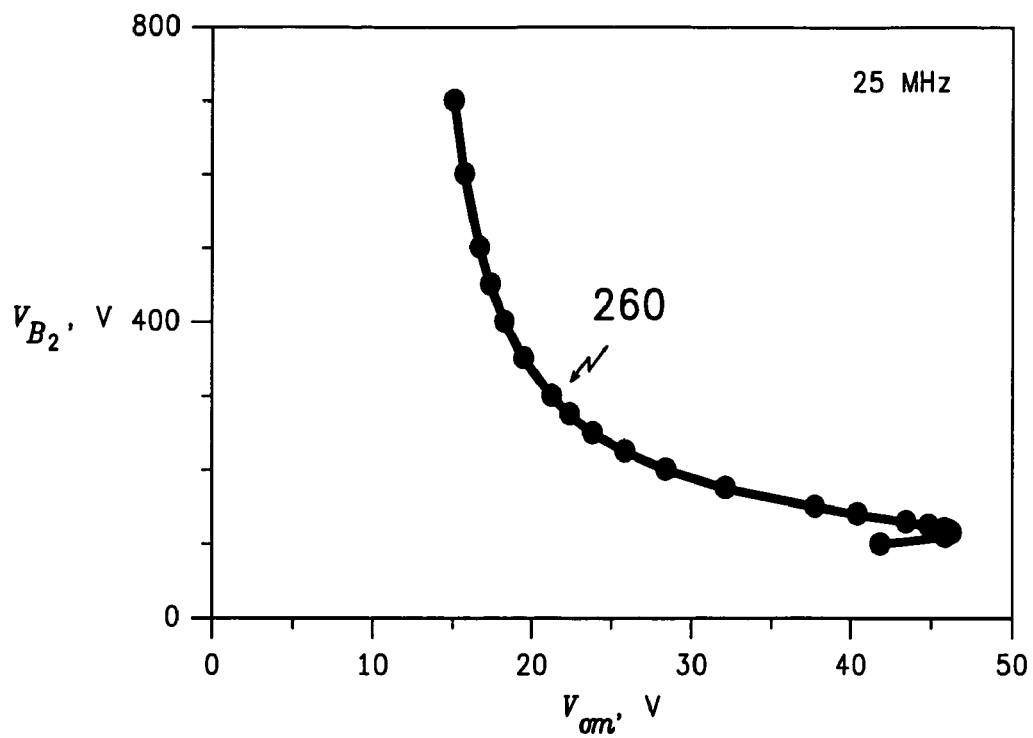
FIG. 25 shows the variations of the bias voltage and efficiency with output amplitude.
Figure 25:
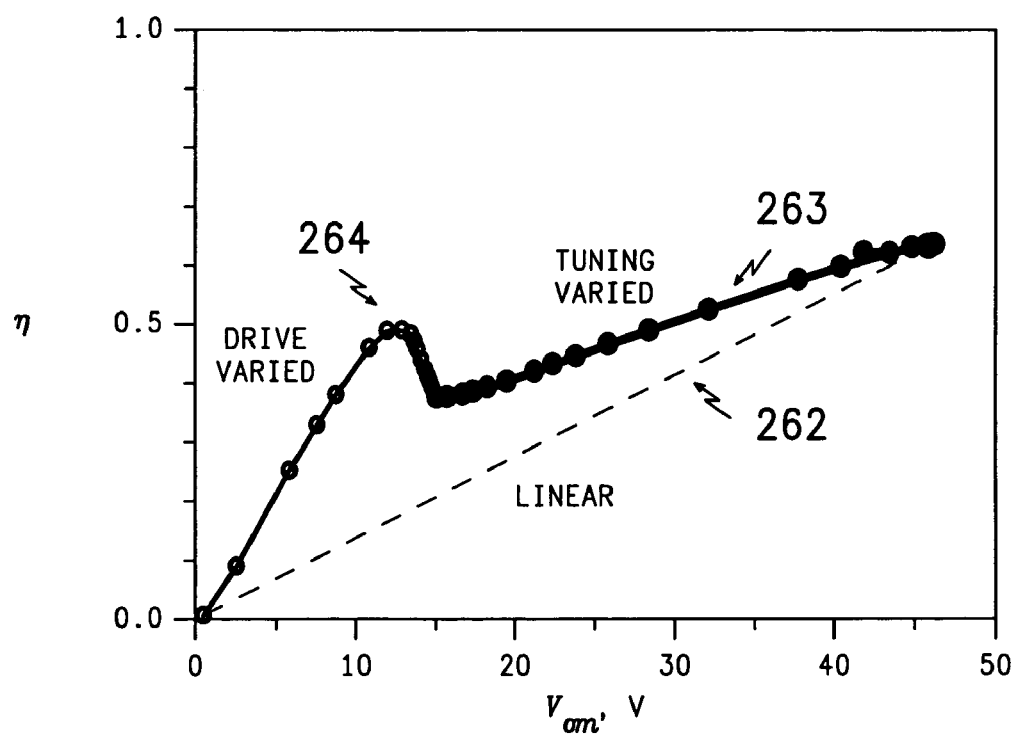

The measured amplitude-modulation characteristics of this electronically tuned PA are shown in FIG. 25 as functions of output amplitude. Variation of bias voltage $V_{B2}$ (260) at terminal 225 from approximately 700 V to 100 V and a corresponding variation in $V_{B1}$ at terminal 223 cause the RF-output voltage at 222 to vary from a maximum of approximately 46 V to a minimum of approximately 15 V. For this range of amplitudes, the efficiency 263 varies from a maximum of approximately 62 percent at PEP to approximately 37 percent at the 15-V output. The corresponding efficiency 262 for linear operation of a similar amplifier is significantly lower.

Electronic tuning of the PA can vary the output amplitude between 46 and 15 V, which is approximately a 10-dB dynamic range. Further reduction of the output amplitude is accomplished by reducing the drive level at 200. The resultant efficiency 264 increases at first and then decreases to zero as the drive and hence the amplifier output at 222 are reduced to zero. For a multicarrier signal with a 10-dB peak-to-average ratio, the efficiency of this electronically tuned PA is 1.85 times that of a corresponding PA operated as a linear amplifier.

Many other variations on this invention are possible, as will be readily recognized by those skilled in the state of the art. The power amplifier can be of any suitable type for the power level and frequency range. Different active devices can be used, depending upon the power and frequency. The electronically tuned filter can be used for impedance matching, eliminating the need for transformers. Other transformers can be used if they provide sufficient bandwidth for the application. More or fewer bypass capacitors and RF chokes can be used as suit the requirements, and RF chokes can be used for bias feed instead of resistors. Different biasing schemes can be used, and in some cases the same bias voltage can be used to tune both electronically variable capacitances. More or fewer electronically variable elements can be used, and electronically variable inductors and transmission lines can be used in addition to or in place of electronically variable capacitors, and many different devices can be used as the electronically variable elements. Changes to the bias and control networks are obviously required for different electronically tunable elements.

INDUSTRIAL APPLICABILITY

The applications of the invention include not only radio broadcasting and radio communication, but also induction heating, plasma heating, magnetic-resonance imaging, industrial-scientific-medical (ISM) applications, and other uses of RF signals of significant power. The invention provides a means of rapidly tuning and matching a power amplifier to a current frequency of operation, load impedance, or output amplitude. Power consumption is reduced in comparison to other techniques for delivering RF power over the same frequency ranges, load impedances, or amplitude variations.

The description of the embodiments of the present invention is given above for the understanding of the present invention. It will be understood that the invention is not limited to the particular embodiments described herein. The invention is capable of various modifications, rearrangements, and substitutions that will now become apparent to those skilled in the art. For example, several of the functional elements illustrated in the schematics may be combined in integrated-circuit implementations performing the same functions, and the improvements provided by the present invention can be combined with other techniques, including those noted above such as feedback and load-impedance monitoring. New electronically tuned elements that will no doubt be developed can be incorporated by analogy to presently known elements. Various types of amplifier (class A, B, C, D, E, F or hybrid combinations) can be used to implement the technique, and the electronic-tuning techniques can be combined with other types of modulation such as gate-bias and high-level-amplitude modulation.

What is claimed is:

1. An electronically tuned circuit, comprising a power amplifier having an amplifier output wherein said amplifier output is coupled to provide amplified signal to an electronically tunable output network, said power amplifier capable of being operated in a large-signal mode, said output network including an electronically tunable reactive component, a control line, and a control input, wherein said control input is connected to a time varying non-DC tuning input signal, wherein electronic tuning of said electronically tunable reactive component includes non-motor operated electronic tuning when said power amplifier is operated in said large-signal mode, wherein said control line extends to said electronically tunable reactive component for providing a control signal derived from said time varying tuning input signal, wherein said control signal varies over more than two values for electronically varying reactance of said electronically tunable reactive component over more than two values, wherein said time varying non-DC tuning input signal is not derived from said amplified output.

2. An electronically tuned circuit as in claim 1, wherein said varying reactance of said electronically tunable reactive component tunes said output network to a selected frequency.

3. An electronically tuned circuit as in claim 1, wherein said varying reactance of said electronically tunable reactive component tunes said output network to maintain a match between said output network and a varying load impedance.

4. An electronically tuned circuit as in claim 1, wherein said varying reactance of said electronically tunable reactive component adds modulation to a large signal in said output network.

5. An electronically tuned circuit as in claim 4, wherein said varying reactance of said reactive component provides a power-amplifier load-impedance locus that substantially maximizes power-amplifier efficiency.

6. An electronically tuned circuit as in claim 5 wherein said varying reactance of said reactive component causes said power-amplifier load impedance to follow a substantially resistive locus, thereby maintaining power-amplifier efficiency near maximum.

7. An electronically tuned circuit as in claim 1, wherein said varying reactance of said reactive component tunes said output network in accordance with a predetermined set of tuning inputs.

8. An electronically tuned circuit as in claim 7, wherein said tuning inputs are selected in accordance with a lookup table.

9. An electronically tuned circuit as in claim 1, wherein said varying reactance of said reactive component tunes said output network in accordance with a predetermined lookup table of tuning inputs.

10. An electronically tuned circuit as in claim 1, wherein said varying reactance of said reactive component tunes said output network in accordance with a sample of the amplifier output.

11. An electronically tuned circuit as in claim 1, wherein said varying reactance of said reactive component tunes said output network in accordance with a sample of the network output.

12. An electronically tuned circuit as in claim 1, wherein said varying reactance of said reactive component tunes said output network in accordance with a sample of a radiated signal.

13. An electronically tuned circuit as in claim 1, wherein said electronically tunable reactive component includes an electronically tunable capacitor.

14. An electronically tuned circuit as in claim 13, wherein said electronically tunable capacitor includes a transistor.

15. An electronically tuned circuit as in claim 13, wherein said electronically tunable capacitor includes a diode.

16. An electronically tuned circuit as in claim 13, wherein said electronically tunable capacitor includes a diode having a control terminal.

17. An electronically tuned circuit as in claim 13, wherein said electronically tunable capacitor includes a micro electro-mechanical system device.

18. An electronically tuned circuit as in claim 13, wherein said electronically tunable capacitor includes a variable-dielectric material.

19. An electronically tuned circuit as in claim 13, wherein said electronically tunable capacitor includes a piezo-electric device.

20. An electronically tuned circuit as in claim 1, wherein said electronically tunable reactive component includes at least one inductive component adapted to be electronically tuned in inductance.

21. An electronically tuned circuit as in claim 20, wherein said at least one inductive component includes a variable-permeability core.

22. An electronically tuned circuit as in claim 20, wherein said at least one inductive component includes a piezo-electric device.

23. An electronically tuned circuit as in claim 1, wherein said electronically tunable reactive component includes at least one transmission line adapted to be electronically tuned in electrical characteristics.

24. An electronically tuned circuit as in claim 23, wherein said at least one transmission-line includes an electrically variable dielectric material.

25. An electronically tuned circuit as in claim 23, wherein said at least one transmission-line includes an electrically variable magnetic material.

26. An electronically tuned circuit as in claim 1, further comprising a passive filter coupled to said output network for removing undesired harmonic frequencies.

27. An electronically tuned circuit as in claim 1, wherein said power amplifier includes an amplifier input, further comprising a second electronically tunable reactive component coupled to said amplifier input for tuning said amplifier input.

28. An electronically tuned circuit as in claim 1, further comprising a controller, said controller for providing a signal for controlling said electronically tunable output network.

29. An electronically tuned circuit as in claim 28, wherein said controller includes a controller input, further comprising an envelope detector with an envelope-detector input and envelope-detector output, said envelope-detector output coupled to said controller input, said envelope detector being responsive to an input RF signal and providing a modulation input to said controller.

30. An electronically tuned circuit as in claim 28, further comprising a drive-level adjustor coupled for adjusting amplitude of a signal provided to said power amplifier.

31. An electronically tuned circuit as in claim 1, further comprising a digital signal processor coupled to said power amplifier and to said electronically tunable output network, said processor for providing a drive signal to said power amplifier and said time varying tuning input signal to said electronically tunable output network.

32. An electronically tuned circuit as in claim 31, further comprising a controller coupled to said digital signal processor and to said electronically tunable output network, wherein output of said digital signal processor is directed to said controller and wherein output of said controller is directed to said electronically tunable output network.

33. An electronically tuned circuit as in claim 1, further comprising a drive-level adjustor coupled for adjusting amplitude of a signal provided to said power amplifier.

34. An electronically tuned circuit as in claim 33, wherein said varying reactance of said reactive component and said drive-level adjuster add modulation to a large signal in said output network.

35. An electronically tuned circuit as in claim 34, wherein when said time varying tuning input signal has an amplitude that is above a threshold said electronically tunable output network is used to control amplitude and when said time varying tuning input signal is below a threshold said drive level adjuster is used to control amplitude.

36. An electronically tuned circuit as in claim 33, further comprising a controller for converting said time varying tuning input signal into tuning signals for control of said electronically tunable reactive component.

37. An electronically tuned circuit as in claim 1, further comprising a bias input for controlling bias level of said power amplifier.

38. An electronically tuned circuit as in claim 37, wherein said bias level is controlled to equal a minimum level necessary to enable operation of said power amplifier, thereby reducing power consumption.

39. An electronically tuned circuit as in claim 37, further comprising a controller for adjusting said bias level in response to at least one from the group including frequency, impedance, and modulation inputs.

40. An electronically tuned circuit comprising:
 (a) means for power amplifying having an output, wherein said means for power amplifying comprises a large-signal mode; and
 (b) means for electronic tuning of said means for power amplifying when said means for power amplifying is operating in said large signal mode, wherein said means for electronic tuning is coupled to said means for power amplifying for receiving an amplified signal, wherein said means for electronic tuning comprises an electronically tunable reactive component, a control line, and a control input, said control input available for connection from external to said means for electronic tuning, further wherein said control input is connected to a time varying non-DC tuning input signal, wherein said electronically tunable reactive component includes non-motor operated electronic tuning, wherein said control line extends to said electronically tunable reactive component for providing a control signal derived from said time varying non-DC tuning input signal, wherein said control signal varies over more than two values for electronically varying reactance of said electronically tunable reactive component over more than two values, wherein said time varying non-DC tuning input signal is not derived from said means for amplifying output.

41. An electronically tuned circuit as in claim 40, wherein said means for power amplifying operates in class E and said electronic-tuning means is capable of being tuned to provide a reactance for optimum class-E operation for a selected frequency.

42. An electronically tuned circuit as in claim 40, wherein said means for power amplifying operates in class E and said electronic-tuning means is capable of being tuned to provide a reactance for optimum class-E operation while delivering power to a selected load impedance.

43. An electronically tuned circuit as in claim 40, wherein said means for power amplifying operates in class E and said electronic-tuning means is capable of being tuned to provide a reactance for optimum class-E operation while simultaneously modulating the output of said electronic-tuning means.

44. An electronically tuned circuit as in claim 40, wherein said means for power amplifying operates in class E and further comprising a fixed reactance for optimum class-E operation at a first frequency, wherein said means for electronic tuning is capable of being tuned to provide said power amplifying means with a load impedance for optimum class-E operation for a selected second frequency.

45. An electronically tuned circuit as in claim 40, wherein said means for power amplifying operates in class E and further comprising a fixed reactance for optimum class-E operation with a first load impedance, wherein said means for electronic tuning is capable of being tuned to provide said power amplifying means with a load impedance for optimum class-E operation with a second load impedance different from said first load impedance.

46. An electronically tuned circuit as in claim 40, wherein said means for electronic tuning is connected to an output terminal, wherein said means for power amplifying operates in class E and said means for electronic tuning is capable of being tuned to provide an impedance for optimum class-E operation when said output terminal is delivering a maximum output signal amplitude, and said means for electronic tuning is capable of being tuned to provide suboptimum class E operation when said output terminal is delivering less than a maximum output signal amplitude.

47. An electronically tuned circuit as in claim 1, comprising a plurality of amplifier subsystems, wherein each of said amplifier subsystems includes one said power amplifier coupled to an electronically tunable output network, wherein said amplifier subsystems are coupled to a power combiner for delivery of signals from said amplifier subsystems to a common load.

48. An electronically tuned power amplifier system as in claim 47, wherein each said varying reactance of each said electronically tunable reactive component tunes said output network to a selected frequency.

49. An electronically tuned power amplifier system as in claim 47, wherein each said varying reactance of said electronically tunable reactive component tunes said output network to match a desired load impedance.

50. An electronically tuned power amplifier system as in claim 47, wherein each said varying reactance of each said electronically tunable reactive component adds modulation to a large signal in each said output network.

51. An electronically tuned power amplifier system as in claim 47, wherein said output networks are adapted to cancel reactances resulting from combining said signals.

52. An electronically tuned power amplifier system as in claim 47, further comprising a controller for generating drive and control signals for each subsystem.

53. An electronically tuned power amplifier system as in claim 52, wherein said controller is adapted to generating drive signals of different phases for production of an amplitude-modulated system output.

54. An electronically tuned power amplifier system as in claim 52, wherein said output networks are adapted to cancel time varying reactances resulting from combining out-of-phase signals.

55. An electronically tuned power amplifier as in claim 47, further comprising a passive filter coupled to said power combiner for removing undesired harmonic frequencies and distortion products.

56. An electronically tuned circuit, comprising one or more power amplifiers having an output, wherein said power amplifiers are capable of operating in a large-signal mode, further wherein said one or more power amplifiers has an output network for receiving an amplified signal, said output network including a tuning input, a network output, an electronically tunable reactive component, a control line, wherein said tuning input is connected to a time varying non-DC tuning input signal, wherein electronic tuning of said electronically tunable reactive component includes non-motor operated electronic tuning when said one or more power amplifiers are operating in said large-signal mode, wherein said control line extends to said electronically tunable reactive component for providing a control signal derived from said time varying non-DC tuning input signal, wherein said control signal varies over more than two values for electronically varying reactance of said electronically tunable reactive component over more than two values, wherein said time varying non-DC tuning input signal is not derived from said amplifier output.

57. An electronically tuned circuit as in claim 56, wherein said varying reactance of said electronically tunable reactive component tunes said output network to a fixed or variable frequency.

58. An electronically tuned circuit as in claim 56, wherein said varying reactance of said electronically tunable reactive component tunes said output network to maintain a match with a varying load impedance at said network output.

59. An electronically tuned circuit as in claim 56, wherein said varying reactance of said electronically tunable reactive component adds modulation to a large signal in said output network.

60. An electronically tuned circuit as in claim 1, wherein said output network includes at least two reactive components connected as a tuned circuit, wherein said electronically tunable reactive component includes at least one of said reactive components.

61. An electronically tuned circuit as in claim 28, wherein said controller converts an input signal to a voltage suitable for controlling said tunable output.

62. An electronically tuned circuit as in claim 1, wherein said electronically tunable reactive component is continuously variable.

63. An electronically tuned circuit as in claim 40, wherein said electronically tunable reactive component is continuously variable.

64. An electronically tuned circuit as in claim 56, wherein said electronically tunable reactive component is continuously variable.

* * * * *